(12) United States Patent
Suzuki et al.

(10) Patent No.: US 6,201,970 B1
(45) Date of Patent: *Mar. 13, 2001

(54) COMMUNICATION METHOD TRANSMITTING APPARATUS AND RECEIVING APPARATUS

(75) Inventors: Mitsuhiro Suzuki, Chiba; Kazuyuki Sakoda, Tokyo, both of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,061

(22) Filed: Dec. 24, 1997

(30) Foreign Application Priority Data

Dec. 26, 1996 (JP) ................................. P8-348804

(51) Int. Cl.⁷ ...................................... H04Q 7/20
(52) U.S. Cl. .......................... 455/450; 455/452; 370/329; 370/465
(58) Field of Search ..................... 455/450, 452, 455/451, 517, 510; 370/468, 329, 330, 336, 337, 345, 347, 465, 431, 441

(56) References Cited

U.S. PATENT DOCUMENTS

| | | | |
|---|---|---|---|
| Re. 35,104 | * 11/1995 | Murakami et al. ................. | 370/468 |
| 4,394,642 | * 7/1983 | Currie et al. ...................... | 341/81 |
| 5,168,493 | 12/1992 | Nelson et al. ..................... | 370/84 |
| 5,448,759 | * 9/1995 | Krebs et al. ...................... | 455/517 |
| 5,541,552 | 7/1996 | Suzuki et al. . | |
| 5,579,339 | * 11/1996 | McClaughry ...................... | 345/326 |
| 5,625,875 | * 4/1997 | Whinnett et al. .................. | 455/509 |
| 5,687,194 | * 11/1997 | Paneth et al. ..................... | 375/283 |
| 5,694,415 | 12/1997 | Suzuki et al. . | |
| 5,711,010 | * 1/1998 | Naddell et al. .................... | 455/509 |
| 5,787,122 | 7/1998 | Suzuki ............................. | 375/267 |
| 5,862,485 | * 1/1999 | Linneweh, Jr. et al. ............ | 455/450 |
| 5,896,374 | * 4/1999 | Okumura et al. .................. | 370/311 |
| 5,956,642 | * 9/1999 | Larsson et al. ................... | 455/449 |
| 6,047,189 | * 4/2000 | Yun et al. ........................ | 455/452 |
| 6,088,335 | * 7/2000 | I et al. ............................. | 370/252 |

FOREIGN PATENT DOCUMENTS

| | | | |
|---|---|---|---|
| 2703859 | 10/1994 | (FR) | H03M/13/22 |
| 02121432 | 5/1990 | (JP) | H04L/9/18 |
| 9608934 | 3/1996 | (WO) | H04Q/7/22 |

* cited by examiner

*Primary Examiner*—Dwayne Bost
*Assistant Examiner*—Joy K. Redmon
(74) *Attorney, Agent, or Firm*—Jay H. Maioli

(57) ABSTRACT

A transmission method according to the present invention is one of simultaneously using first and second communication resources by variable allocation and includes a step of, if the first or second communication resource is solely used, interleaving data by using the first or second communication resource as a unit to transmit it, and a step of, if the first and second communication resources are simultaneously used, interleaving data by using the whole of the first and second communication resource as a unit to transmit it.

48 Claims, 19 Drawing Sheets

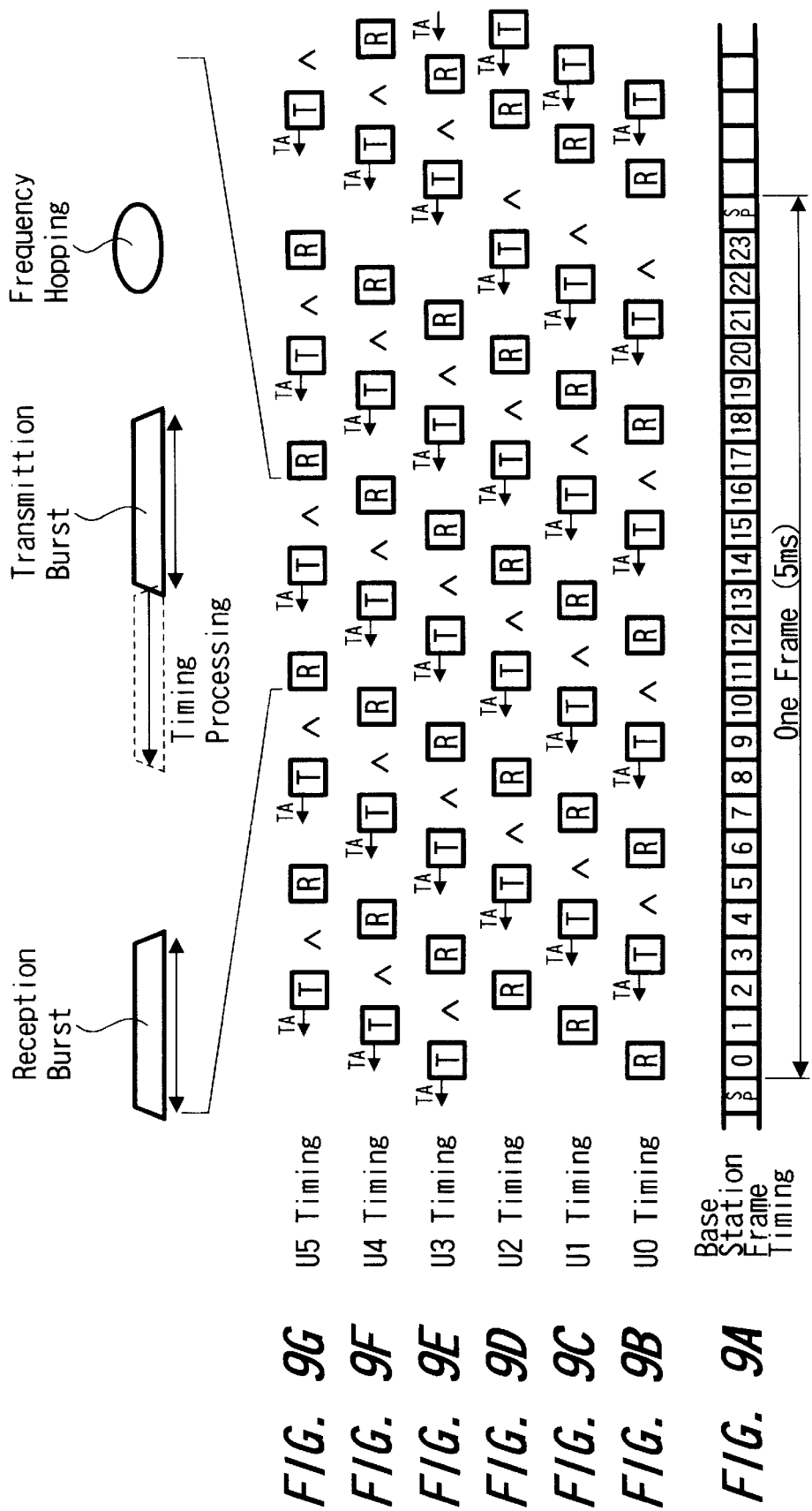

COMMUNICATION METHOD TRANSMITTING APPARATUS AND RECEIVING APPARATUS

BACKGROUND OF THE INVENTION

1. Field of the Invention

The present invention relates to a method of communication suitable for use in, for example, a base station and a terminal apparatus in a radio telephone system, and a transmission apparatus and a reception apparatus to which the method of communication is applied.

2. Description of the Related Art

In a mobile communication such as a radio telephone system or the like, multiple access is provided in which a plurality of base stations are provided at a predetermined interval to form a service area and each of the base stations is connected to a plurality of mobile stations (terminal apparatus). In this case, a predetermined transmission band is allocated in advance to each base station; a plurality of transmission channels are set in the transmission band; in the case of a request for communication or the like from each terminal apparatus, any of the transmission channels is allocated to the terminal apparatus; and the terminal apparatus side initiates communication by way of the base station using the allocated transmission channel.

For example, such systems of communication wherein the transmission channels are set include a frequency division multiple access (FDMA), a time division multiple access (TDMA), a code division multiple access (CDMA) and so on.

Referring to each method, the communication system of FDMA system is one in which a plurality of transmission channels are provided by dividing the transmission band prepared by a unit of frequency. The communication system of TDMA system is one in which a transmission channel is divided by a predetermined time unit to form a plurality of time slots within a single transmission channel, each of the time slots being allocated to the terminal equipments to be linked. Therefore, it is possible to link the plurality of terminal equipment using the single transmission channel. The communication system of CDMA system is one in which a specified code is allocated to each of the terminal equipments and a carrier having the same frequency is subjected to spectrum spread modulation by the code for transmitting it to the base station. The receiving side achieves synchronization with each code to identify a signal from a desired terminal apparatus.

In a radio telephone system, even if any of the above systems is employed and a transmission channel is set in accordance therewith, a transmission capacity of data which can be transmitted on one transmission channel is previously determined and hence the transmission capacity cannot be changed depending upon the kink of transmission data. In a general radio telephone system, the transmission capacity of one transmission channel is set so as to be a capacity which allows transmission of audio data for speech.

Recently, while attempt to transmit various data other than audio data by using a radio terminal such as a portable telephone or the like has been made, such a limitation that data of only a predetermined transmission capacity can be transmitted on one transmission channel brings the disadvantage that it takes considerable time to transmit data of a large capacity. In order to solve this problem, it may be sufficient to set a large transmission capacity as the transmission capacity of data which can be transmitted on one channel. However, as the transmission capacity of one channel is increased, a frequency band width of one transmission channel and so on must be set wide to that extent, which consequently reduces the number of transmission channels set in a transmission band allocated to one base station. Moreover, if the data of a comparatively small capacity such as the audio data is transmitted, the data amount to be transmitted on each of transmission channels becomes smaller as compared with the transmission capacity of the transmission channel, which disadvantageously causes an ineffective use of the transmission band.

In order to overcome the above disadvantage, the assignee of this application has proposed a communication method and a communication apparatus to which a transmission system permitting a transmission capacity to be changed is applied (in Japanese patent applications No. 8-312295 and so on). In the above proposed communication system and apparatus, when digital data is transmitted by wireless, an interleaving processing for changing a data arrangement of transmission data is carried out and hence even if a part of data lack upon reception, then it is possible to restore the data by an error correction processing and so on.

Since the above interleaving processing is carried out on condition that data of a predetermined transmission capacity is interleaved, if the above interleaving processing is applied to a communication system with a variable transmission capacity as it is, then a processing for precisely restoring the interleaved data arrangement to its original data arrangement may be disabled on the reception side when the transmission capacity is changed.

SUMMARY OF THE INVENTION

In view of such aspects, it is an object of the present invention to correctly carry out an interleaving processing in a radio communication such as a radio telephone system or the like even if a transmission capacity is changed.

According to a first aspect of the present invention, a transmission method of simultaneously using first and second communication resources by variable allocation includes a step of, if the first or second communication resource is solely used, interleaving data by using the first or second communication resource as a unit to transmit it, and a step of, if the first and second communication resources are simultaneously used, interleaving data by using the whole of the first and second communication resource as a unit to transmit it.

According to a second aspect of the present invention, a reception method of simultaneously using first and second communication resources by variable allocation includes a step of, if a signal transmitted with the first or second communication resource being solely used is received, deinterleaving data by using the first or second communication resource as a unit, and a step of, if a signal transmitted with the first and second communication resources being simultaneously used is received, deinterleaving data by using the whole of the first and second communication resource as a unit.

According to a third aspect of the present invention, a transmission apparatus for simultaneously using first and second communication resources by variable allocation includes an interleaving unit for interleaving a transmission data, and a transmission unit for transmitting an output from the interleaving unit. The interleaving unit, if the first or second communication resource is solely used, interleaves data by using the first or second communication resource as a unit to transmit it, and, if the first and second communication resources are simultaneously used, interleaves data by using the whole of the first and second communication resource as a unit to transmit it.

According to a fourth aspect of the present invention, a reception apparatus for simultaneously using first and second communication resources by variable allocation includes a reception unit for receiving a signal, and a deinterleaving unit for deinterleaving an output from the reception unit. The deinterleaving unit, if a signal transmitted with the first or second communication resource being solely used is received, deinterleaves data by using the first or second communication resource as a unit, and, if a signal transmitted with the first and second communication resources being simultaneously used is received, deinterleaves data by using the whole of the first and second communication resource as a unit.

BRIEF DESCRIPTION OF THE DRAWINGS

FIGS. 9A to 9G are diagrams used to explain a transmission timing of the communication system applied to the second embodiment;

DESCRIPTION OF THE PREFERRED EMBODIMENTS

A first embodiment according to the present invention will hereinafter be described with reference to FIGS. 1 to 5.

In the first embodiment, the present invention is applied to a radio telephone system to which a TDMA system is applied. The radio telephone system is a radio telephone system of a cellular system in which a base station is located at a predetermined interval and thereby a communication area is set.

Figure 1:
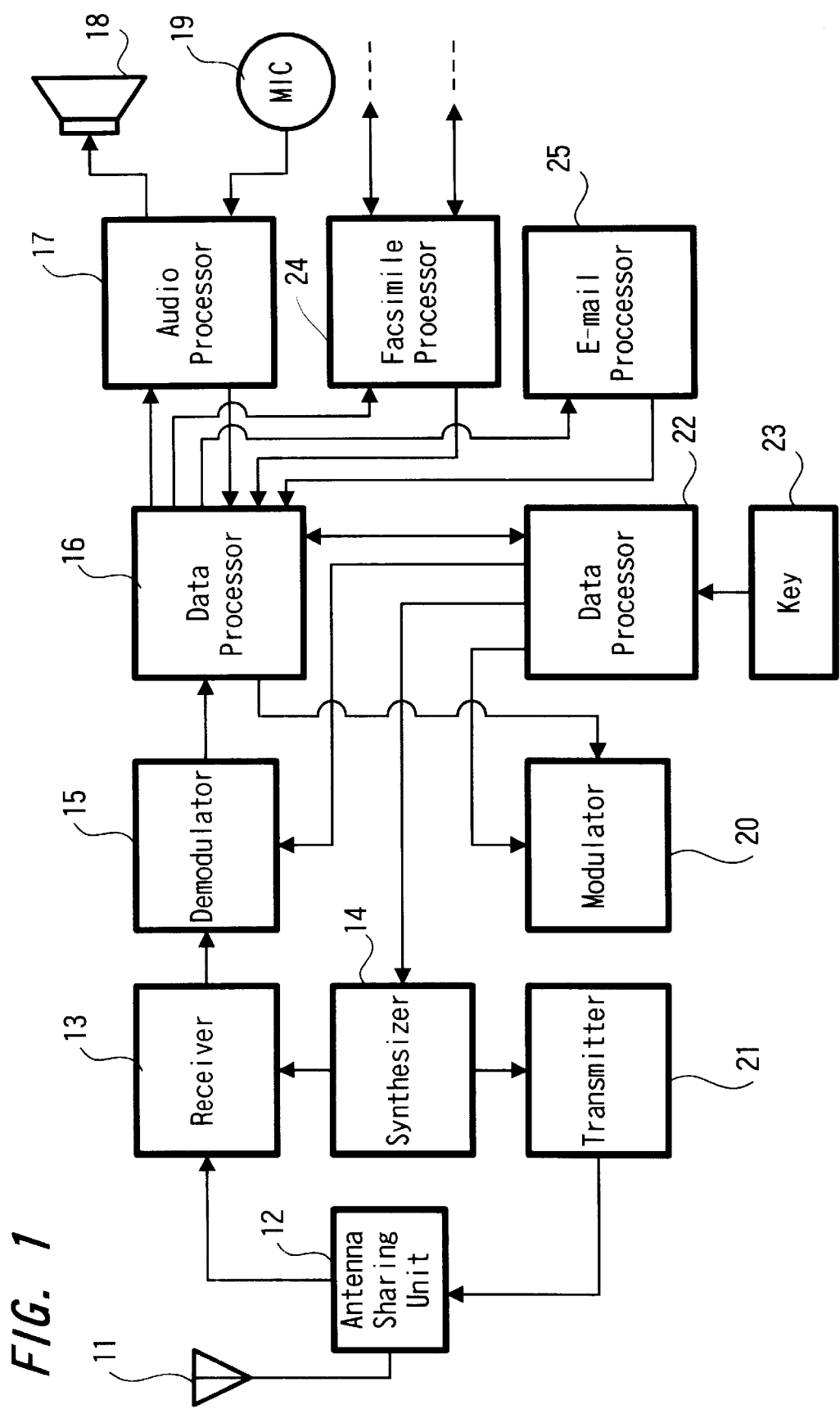
FIG. 1 is a block diagram showing an arrangement of a terminal apparatus according to a first embodiment of the present invention.

FIG. 1 is a diagram showing a configuration of a terminal apparatus used in the radio telephone system. Referring first to the configuration of a reception system, an antenna 11 is connected to a reception unit 13 through an antenna sharing device 12, and an output frequency signal from a frequency synthesizer 14 constituted by a PLL circuit or the like is supplied to the reception unit 13. The output frequency signal from the frequency synthesizer 14 is mixed with a reception signal supplied from the antenna 11 to the reception unit 13 to frequency convert on the reception signal at a predetermined frequency into an intermediate frequency signal. In this case, the output frequency of the frequency synthesizer 14 is determined based on the control of a control unit 22 which is a system controller for controlling the communication operation of this terminal apparatus.

The reception signal which has been converted into an intermediate frequency signal is supplied to a demodulation unit 15 where it is subjected to a demodulation process based on a specified communication system to be converted into a reception data which is a symbol string. In this case, the demodulation unit 15 carries out a de-interleaving processing for restoring an arrangement of data interleaved upon transmission to its original data arrangement. This de-interleaving processing will be described in detail later on. The reception data which is a demodulated symbol string is supplied to a data processing unit 16 which extracts required data and supplies the same to corresponding signal processing units.

For example, audio data included in the reception data is supplied to an audio processing unit 17, converted into an analog audio signal by an audio process in the audio processing unit 17, and emitted as sounds from a speaker 18 connected thereto. Facsimile data included in the reception data is supplied to a facsimile processing unit 24 and is converted by this facsimile processing unit 24 into data to be supplied to a facsimile apparatus (not shown). Further, electronic mail data included in the reception data is supplied to an electronic mail processing unit 25 and is converted by this electronic mail processing unit 25 into data to be supplied to an electronic mail receiving apparatus (such as a personal computer apparatus, personal digital assistant or the like which is not shown). Control data included in the reception data is supplied to the control unit 22 which executes the corresponding communication control. Those reception data types are determined from the control data or the like included in the reception data.

Referring next to a transmission system of the terminal apparatus, for example, in the case of audio data, an audio signal picked up by a microphone 19 connected to the audio processing unit 17 is converted by the audio processing unit 17 into digital audio data for transmission, and this audio data is supplied to a TDMA processing unit 16 and is located at a predetermined position in a symbol string to be transmitted. At the other positions in the symbol string to be transmitted, a predetermined synchronization pattern, a control data supplied from the control unit 22 and the like are located.

The transmission data which is a symbol string output from the TDMA processing unit 16 is supplied to a modulation unit 20 to perform a modulation process for transmission, and the modulated signal is supplied to a transmission unit 21 where it is mixed with a frequency signal output by the frequency synthesizer 14 to be frequency-converted into a predetermined transmission frequency. A transmission signal at this transmission frequency is supplied through the antenna sharing device 12 to the antenna 11 to be transmitted on a wireless basis. Upon modulation, the modulation unit 20 carries out an interleaving processing for changing an arrangement of the transmission data. This interleaving processing will be described in detail later on.

A facsimile signal transmitted from a facsimile apparatus (or a computer apparatus to which a modem for facsimile communication is connected) which is not shown to the facsimile processing unit 24 is converted by the facsimile processing unit 24 into facsimile data, and the facsimile data is supplied to the TDMA processing unit 16 where it is subjected to a transmission process similar to that in the case of audio data as described above. Further, electronic mail data for transmission supplied from an apparatus for transmitting and receiving an electronic mail which is not shown to the electronic mail processing unit 25 is converted by the electronic mail processing unit 25 into electronic mail data to be transmitted, and the electronic mail data is supplied to the TDMA processing unit 16 where it is subjected to a transmission process similar to that in the case of audio data as described above.

Various keys 23 are connected to the control unit 22, and operations such as transmission and reception and so on are performed with the keys 23. Further, the terminal apparatus in the present embodiment has a capability of performing a communication process on a plurality of transmission channels simultaneously, and a transmission channel is set under the control of the control unit 22. The process of setting a plurality of transmission channels simultaneously will be described later on.

Figure 2:
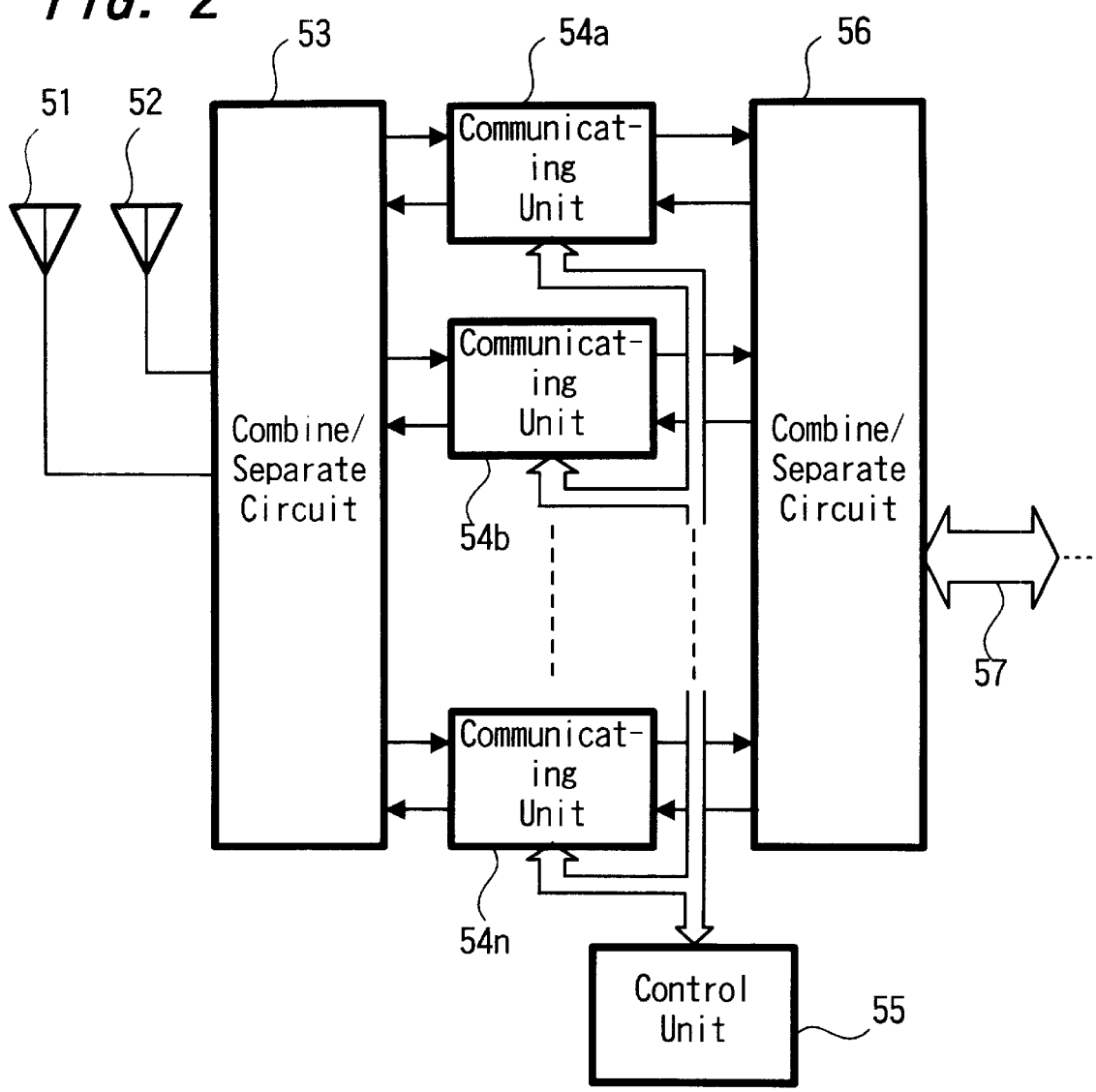
FIG. 2 is a block diagram showing an arrangement of a base station according to the first embodiment.

A configuration of a base station which communicates with the terminal apparatus will now be described with reference to FIG. 2. Although the base station has a basic configuration for a communication process which is similar to that of the terminal apparatus an arrangement, which communicates with a plurality of terminal apparatuses, is different from the terminal apparatus. Specifically, antenna systems 51, 52 of two systems are connected to a synthesis/separation circuit 53, and reception signals are separated by the synthesis/separation circuit 53 at every transmission channel or the like to separate reception signals from each terminal apparatus into signals of a plurality of systems for each of one or a plurality of terminal apparatuses. The reception signals in the respective separated systems are supplied to respective different communication units 54a, 54b, . . . , 54n (n is an arbitrary number) to be subjected to a reception process and a demodulation process. The demodulated reception data is subjected to a transmission process for transmitting it to an exclusive line 57 connected to a communication control station which coordinates base stations, and the processed signal is transmitted to the exclusive line 57 through a synthesis/separation circuit 56.

Further, a signal transmitted from the exclusive line 57 to the base station is separated by the synthesis/separation circuit 56 into signals in a plurality of systems. The separated signals in respective systems are supplied to respective different communication units 54a, 54b, . . . , 54n, and a modulation process and a transmission process for transmission to the terminal apparatuses are performed after a process of receiving from the exclusive line 57 to supply the signals to either of the antennas 51, 52 through the synthesis/separation circuit 53 for transmission on a wireless basis.

The processes of transmission and reception at each of the communication units 54a–54n of the base station are performed under control of a control unit 55, and the addition and discrimination of necessary control data or the like are also carried out under control of the control unit 55. In the modulation processing and the demodulation processing at each of the communication units 54a to 54n, the interleaving and de-interleaving processing for changing the data arrangement are carried out, respectively.

Communication conditions for communication performed between the terminal apparatus and base station described above will now be described. In the embodiment, a transmission capacity for communication between the terminal apparatus and the base station can be adaptively set. The process of setting the transmission capacity adaptively will be described referring to a case wherein the TDMA system (time division multiple access system) is used as the system for communication between the terminal apparatus and base station. In this case, a transmission frequency of an up-link circuit from the terminal apparatus to the base station and a transmission frequency of a down-link circuit from the base station to the terminal apparatus are set different from each other, and thus a communication circuit between the terminal apparatus and the base station is set.

Figure 3:
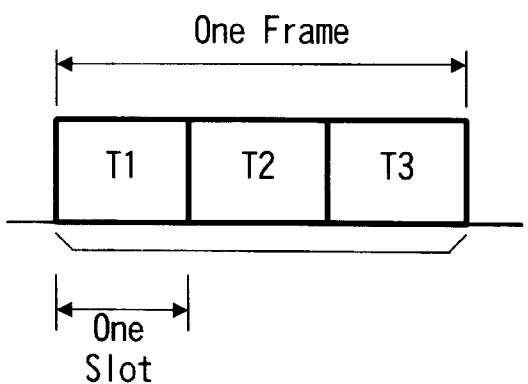
FIG. 3 is a diagram used to explain a frame configuration according to the first embodiment by way of example.

In the TDMA system, one transmission band is divided by a predetermined time unit, and thereby a multiple access permitting simultaneous use of one transmission band by a plurality of terminal apparatus is carried out. Specifically, if one transmission band is divided into three, then, as shown in FIG. 3, one frame is defined by a predetermined time unit and this frame configuration is repeated. It is assumed that three parts into which one frame is divided are time slots T1, T2 and T3. One time slot has a time ranging substantially from several hundred $\mu$sec. to several msec., and each of the time slots T1, T2, T3 generally has the same time interval. However, it may have different time interval in order to change an information amount which can be transmitted in each of the time slots. A burst signal during each of the time slot intervals is intermittently transmitted and received between the terminal apparatus and the base station.

Figure 4A:
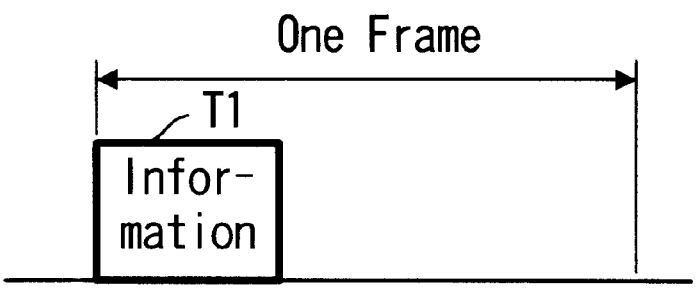
FIGS. 4A to 4C are diagrams used to explain a communication processing according to the first embodiment.

In this embodiment, each of the transmission channel (transmission frequencies) in the transmission band for the up-link circuit and each of the transmission channel (transmission frequencies) in the transmission band for the down-link circuit has the frame configuration of the same timing shown in FIG. 3. For example, it is assumed that as shown in FIG. 4A, a communication circuit using the time slot T1 of each frame is set between a certain terminal apparatus and the base station and then a bidirectional communication for transmitting a predetermined information (audio data, facsimile data, electronic mail data and so on) is carried out. In the following description, a time slot in each frame is used in both of the up-link circuit and the down-link circuit in the same state if not specially indicated. This frame configuration is that for a so-called information channel used for transmission of information such as the audio data or the like. A control channel used for transmission of a control data used for control of call-out and call-in is set independently of the information channel.

It is assumed that while the communication circuit using the time slot T1 is set in this configuration, a request to increase the transmission capacity of the information to be transmitted (i.e., a request to increase a transmission speed) is issued. At this time, if there is any free slot in the same transmission frequency, this free slot is added and allocated to this communication circuit.

Figure 5:
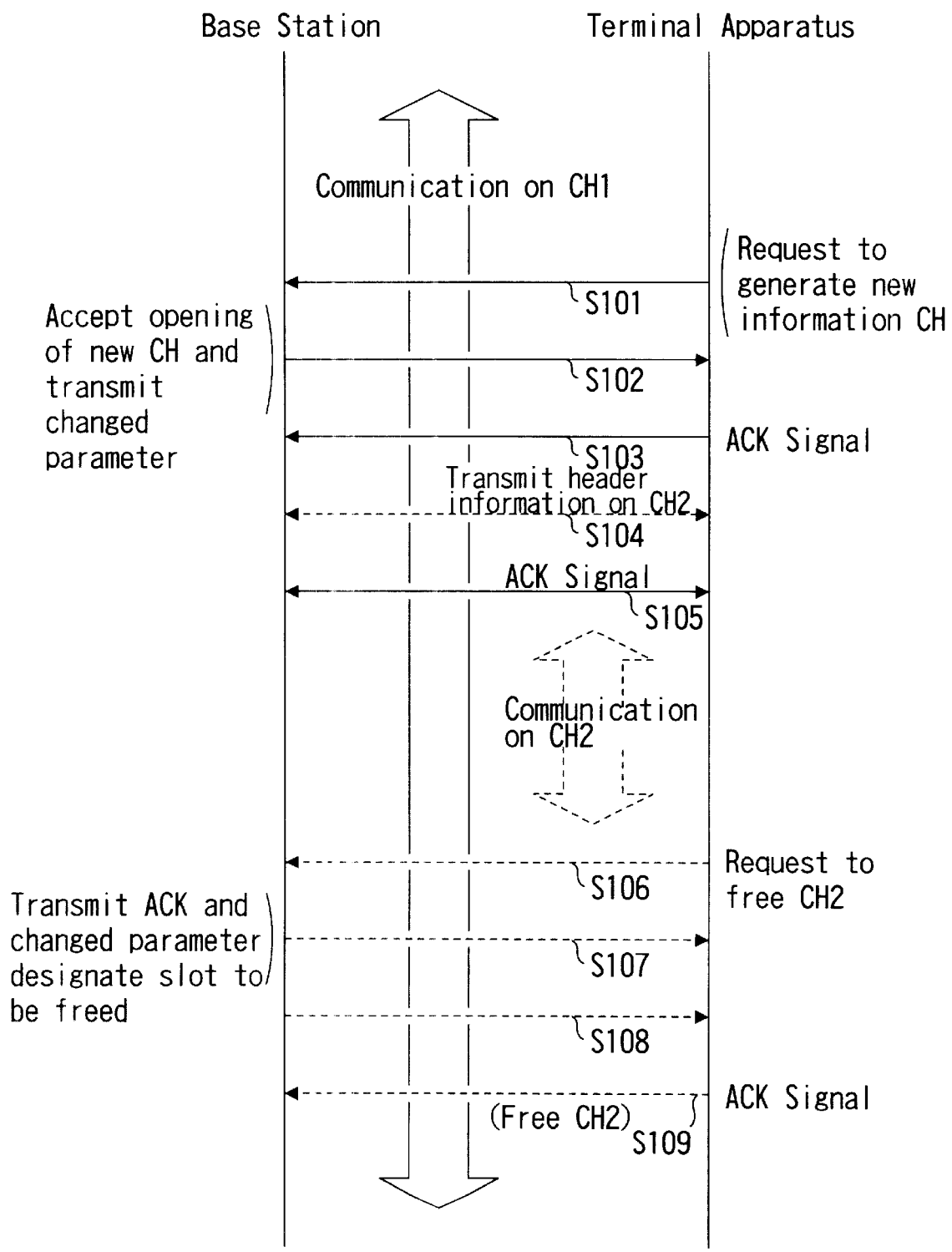
FIG. 5 is a diagram used to explain a connection sequence of a communication according to embodiments of the present invention.

FIG. 5 is a diagram showing a connection sequence in the above case. In FIG. 5, a communication on a channel 1 (CH1) is a communication continuously carried out with the time slot T1 used (communication shown by a solid line in FIG. 5), and a communication on a channel 2 (CH2) is a newly added communication using the time slot T2 (communication shown by a broken line in FIG. 5). It is initially assumed that while the communication on the channel 1 using the time slot T1 is carried out, increase of the transmission capacity is demanded to start transmission of new information from the terminal apparatus. At this time, the terminal apparatus transmits a request signal S101 for requesting generation of a new information channel to the base station by using a predetermined period in the time slot T2 of the up-link circuit which is being used for communication.

When receiving the request signal S101 for requesting generation of the new information channel, the base station detects a free slot in the same transmission frequency and transmits a signal indicative of acceptance of opening a new channel in the free slot and a signal S102 indicative of parameters changed in accordance with the acceptance. The signal S102 is transmitted by using a predetermined period in the time slot T1 (channel 1) of the down-link circuit which is being used for communication. When receiving and confirming the signal indicative of the acceptance and so on, the terminal apparatus transmits an acknowledge (ACK) signal S103 by using the time slot T1 of the up-link circuit.

Figure 4B:
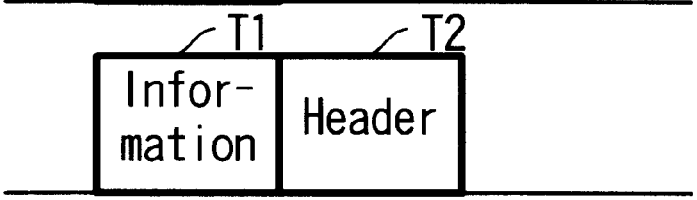

The parameters transmitted from the base station includes not only data of the number (in this case, the slot T2) of a slot allocated as a new channel but also data of a timing at which communication is started in the slot. At the timing indicated by the data, the base station starts transmitting a header information signal by using the newly allocated time slot T2 of the down-link circuit, and the terminal apparatus starts transmitting a header information signal by using the newly allocated time slot T2 of the up-link circuit (these processings are indicated by reference number S104 in FIG. 5). Accordingly, as shown in FIG. 4B, while the information such as the audio data or the like is continuously transmitted by using the slot T1 in each of frames, the transmission of the header information signal is started by using the time slot T2. The header information signal is a predetermined signal formed of data having a specific pattern.

Figure 4C:
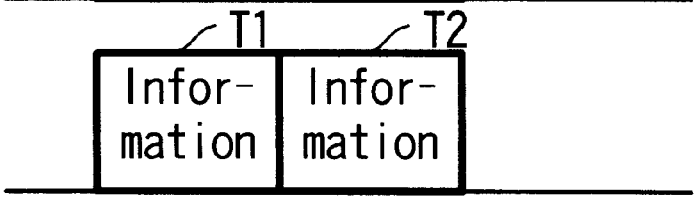

When the bidirectional transmission S104 of the header information signal by using the newly allocated time slot T2 is started, a reception-side control unit determines whether or not the header information signal can be correctly received. If it is determined that the header information signal is received correctly, the reception-side control unit transmits an acknowledge signal S105 to the transmission side by using a predetermined period in the time slot T1. When both sides receives and discriminates the acknowledge signals S105, the transmission of the information by using the newly allocated time slot T2, and a communication circuit between the base station and one terminal apparatus is set in a state as shown in FIG. 4C. When information is transmitted by using the time slots T1 and T2, information of the same kind may be transmitted with being divided into two for the two time slots T1 and T2 or informations of different kinds (e.g., an audio data and an electronic mail data) may be transmitted by using the time slots T1 and T2, respectively.

A processing of changing a transmission capacity to the original transmission capacity (a processing of reducing a transmission capacity when a transmission circuit using two time slots is initially set) will be described. When the transmission capacity is reduced in accordance with the request from the terminal apparatus, as shown in FIG. 5, the terminal apparatus transmits a request signal S106 used for requesting the base station to open the time slot T2 to the base station by using the time slot T2 (channel 2) in the up-link circuit. When the base station receives the opening request signal S106 and its control unit confirms it, the base station transmits an acknowledge signal and a signal S107 indicative of parameters to be changed to the terminal apparatus by using the time slot T2 of the down-link circuit. After transmitting the signal S107 indicative of the parameters to be changed, the base station transmits a signal S108 for designating the number of a slot to be freed to the terminal apparatus as a trailer information signal used for freeing the circuit by using the time slot T2 of the down-link circuit. When the terminal apparatus receives the signal S108 and its control unit confirms it, the terminal apparatus transmits an acknowledge signal (ACK signal) S109 to the base station by using thee time slot T2 of the up-link circuit and terminates the communication using the time slot T2, thereby freeing the communication circuit using the time slot T2 (channel 2). Thereafter, only the communication circuit using the time slot T1 is still carried out, and hence the communication circuit is set in a state shown in FIG. 4A.

An interleaving processing and a de-interleaving processing applied to the communication processing according to this embodiment for thus changing the transmission capacity will be described. Two processings, i.e., a processing for changing the interleaving processing between those carried out before and after the number of the channel is increased to thereby increase the transmission capacity and a processing for independently setting the interleaving processing for each channel will be described.

Figures 6A, 6B, 6C:
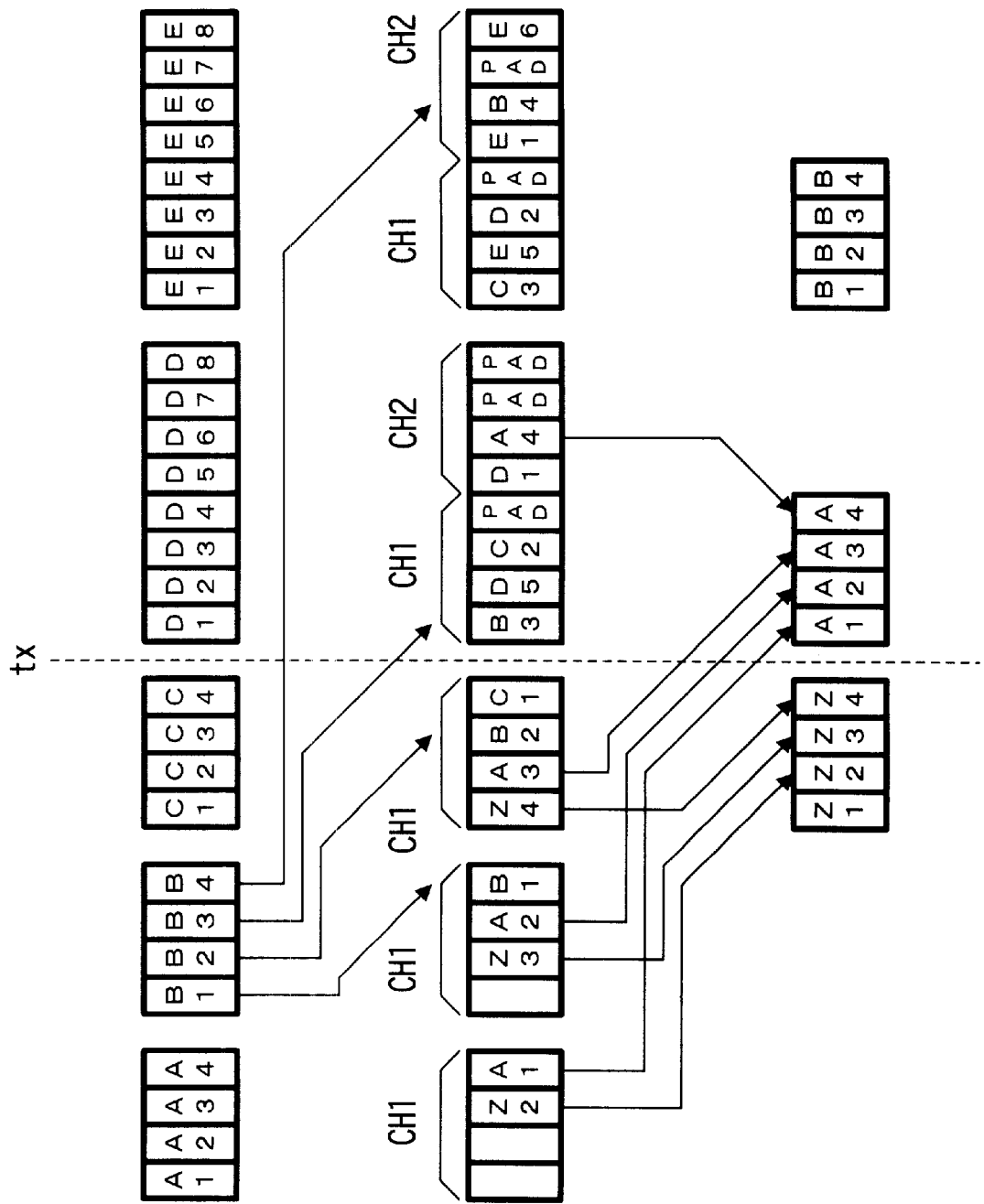
FIGS. 6A to 6C are diagrams used to explain an interleaving processing according to the first embodiment (in which an interleaving processing is changed in response to increase of channels)

The processing for changing the interleaving processing in response to the change of the transmission capacity will be described with reference to FIGS. 6A–6C. In FIGS. 6A–6C, the communication is carried out on the assumption that the transmission capacity is changed at the timing $t_x$ and that the communication circuit using only the channel 1 (time lot T1) is set before the timing $t_x$ and the communication circuit using the channels 1 and 2 (time slots T1 and T2) is set after the timing $t_x$. In this case, it is assumed that an interleaving processing for dispersing data of one frame in four frames is carried out and data obtained before the interleaving processing on the transmission side is the data shown in FIG. 6A. Specifically, in a certain frame which is being used for communication by using only one frame, while the data A1, A2, A3, A4 are transmission data in one time slot period, the interleaving processing on the transmission side disperses the data A1 to A4 in slots of another frame periods as shown in FIG. 6B. Then, the interleaved data is modulated and transmitted.

The reception side carries out the de-interleaving processing for restoring the arrangement of the transmitted data dispersed in the four frame periods of the channel 1 to its original data arrangement, thereby obtaining data of a slot configuration of the original data arrangement.

After the timing $t_x$, the amount of the data transmitted in one frame becomes double and hence the data are transmitted by using two time slot periods. For example, in a frame immediately after the timing $t_x$, transmission data D1, D2, ..., D8 in two slot periods are generated as shown in FIG. 6A. The data D1 to D8 of two time slot periods forming one frame is processed as data of one series and subjected to the interleaving processing for dispersing the data D1 to D8 in four frames of two channels. As shown in FIG. 6B, interleaved transmission data of each frame is transmitted while being divided into two parts for the channel 1 (time slot T1) and the channel 2 (time slot T2). A data PAD in the transmission data shown in FIG. 6B depicts a period when the data is not transmitted (practically in this period some dummy data is transmitted or a transmission power is set to 00) and a period when, immediately after the number of the channel is increased, there is no data to be transmitted in a channel newly added.

The data thus interleaved and transmitted is subjected to the de-interleaving processing for de-interleaving the received data of eight time slots in four frames, thereby being restored to its original data arrangement. Then, the data of two time slots is extracted from received data of every frame. FIGS. 6A–6C are simplified diagram used to explain outlines of the interleaving processing and the de-interleaving processing. In the actual interleaving and de-interleaving processings, the data are arranged in more complicated manner.

Since the number of channels to be simultaneously transmitted is increased and at the same time the interleaving processing and the de-interleaving processing are switched to those corresponding to the transmission capacity of the increased channels, it is easy to carry out the processings in response to increase of the channel number. When the number of channel is reduced, the interleaving processing and the de-interleaving processing can be carried out satisfactorily by switching them in a manner reverse to the example shown in FIG. 6.

Figures 7A, 7B, 7C:
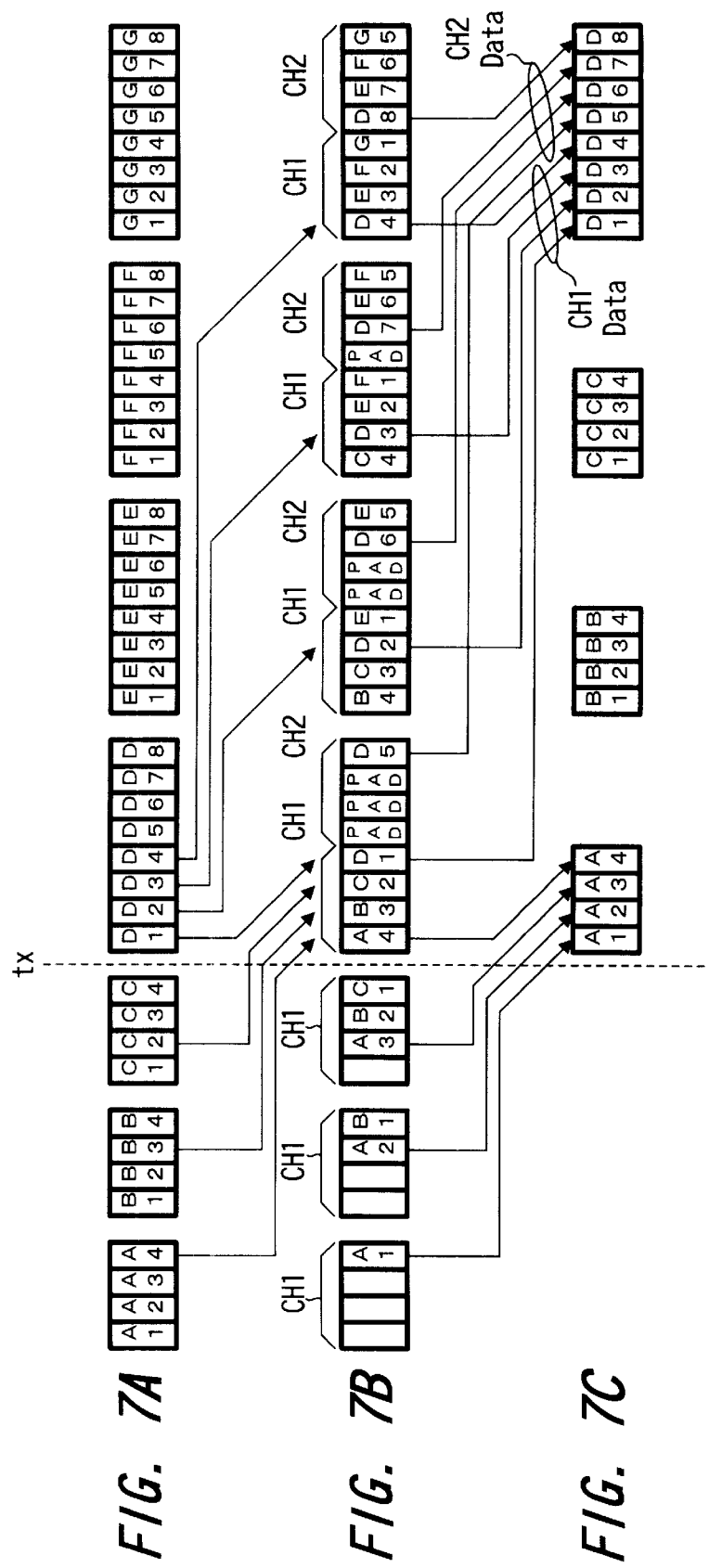
FIGS. 7A to 7C are diagrams used to explain an interleaving processing according to the first embodiment (in which an interleaving processing is independently carried out for each of channels)

Another interleaving processing for individually setting the interleaving processings for each channel even when the new channel is added will be described with reference to FIGS. 7A–7C. In FIGS. 7A–7C, the communication is carried out on the assumption that the transmission capacity is changed at the timing $t_x$ and that the communication circuit using only the channel 1 (time lot T1) is set before the timing $t_x$ and the communication circuit using the channels 1 and 2 (time slots T1 and T2) is set after the timing $t_x$. In this case, it is assumed that an interleaving processing for dispersing data of one frame in four frames is carried out. Specifically, FIG. 7A shows the data which is obtained before the interleaving processing on the transmission side. FIG. 7B shows the interleaved and transmitted data, showing a state in which the data is dispersed in four frames and then transmitted. FIG. 7C shows data restored by the de-interleaving processing, showing a data of one frame is restored from the data dispersed in four frames. The interleaving state before the timing $t_x$ is similar to that described with reference to FIGS. 6A–6C.

After the channel 2 (time slot T2) is added at the timing $t_x$, the transmission data of the channel 1 and the channel 2 are independently subjected to the interleaving processings. Specifically, a data (e.g., data D1 to D4 of a frame immediately after the timing $t_x$) of the first half of the transmission data of two slots amount of one frame after the timing $t_x$ are, as shown in FIG. 7B, dispersed in slots transmitted by using the channel 1 and then interleaved. A data (e.g., data D5 to D8 of a frame immediately after the timing $t_x$) of the second half of the transmission data of two slots amount of one frame are, as shown in FIG. 7B, dispersed in slots transmitted by using the channel 2 and then interleaved.

The interleaving state of the data transmitted on the channel 1 is not different before and after the new channel is added, and the data on the added channel 2 is also repeatedly subjected to the interleaving processing similar to that for the channel 1. As shown in FIG. 7C, of the de-interleaved data, data of the first half of each frame is the data transmitted on the channel 1, and the data of the second half thereof is the data transmitted on the channel 2. In the processing shown in Similarly to FIGS. 6A–6C, FIGS. 7A–7C are simplified diagrams used to explain outlines of the interleaving processing and the de-interleaving processing. In the actual interleaving and de-interleaving processings, the data are arranged in more complicated manner.

Since the interleaving and de-interleaving processing shown in FIGS. 7A–7C are carried out, even if new channels are provided, then the same processing is continuously carried out in each of the channels. Therefore, it is possible to satisfactorily interleave and transmit the data without any change of the interleaving processing accompanying the change of the transmission capacity. Though not shown in FIGS. 7A–7C, even if the number of channels are reduced, the interleaving processing for the data in the channel which is still used after the reduction of the number of channels, which enables the proper interleaving processing to be easily carried out.

While in the processing shown in FIGS. 7A–7C both of the data on the channels 1 and 2 are subjected to the interleaving processing providing the same data arrangement, the arrangement of the interleaved data on the channel 1 and the arrangement of the interleaved data on the channel 2 may be set different from each other. The transmission capacity may be increased and reduced not only twice or ½ time but also by using a multiple of an integer of a minimum transmission capacity.

Either of the processing for changing an interleaving pattern in response to the transmission capacity and the processing for repeating the same interleaving pattern when the transmission capacity is increased is set, both of the processings may be combined and used. Specifically, in the connection sequence shown in FIG. 5, for example, when the transmission of the header information signal in the processing S104 for starting the communication on the channel 2 during the communication using the channel 1 is started, the same interleaving pattern is set for the data of the channels 1 and 2 independently, thereby the transmission and reception processings being carried out. When the timing when the audio data and so on are practically transmitted after the provision of the new channel is determined based on the transmission of the ACK signal S105, the interleaving pattern used for processing the data on the channels 1 and 2 as data of one series to interleave it may be set, thereby the data being transmitted and received.

A second embodiment will be described with reference to FIGS. 8 to 21.

In this embodiment, the present invention is applied to a radio telephone system of a cellular system according to a multicarrier transmission system. The multicarrier transmission system will be described in detail with reference to FIGS. 8 to 10. A communication system according to this embodiment is arranged as a so-called multicarrier system in which a plurality of subcarriers are continuously disposed within a band allocated in advance, and the plurality of subcarriers within the single band are utilized on a single transmission path at the same time. Further, the plurality of subcarriers within the single band are collectively divided in the band to be modulated.

Figure 8:
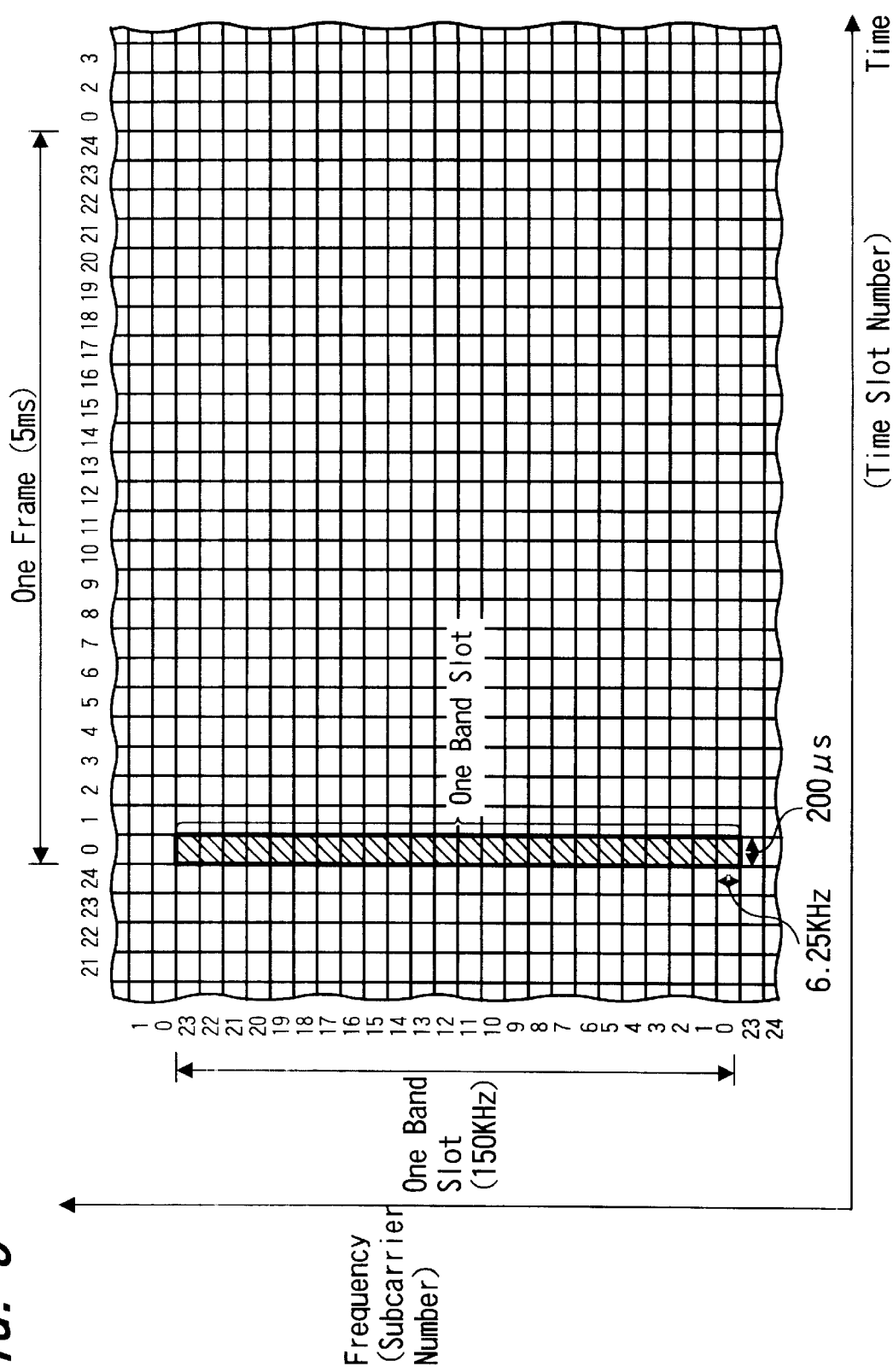
FIG. 8 is a diagram used to explain a slot arrangement of a communication system applied to a second embodiment of the present invention.

The arrangement thereof will be described below. FIG. 8 is a diagram showing a slot arrangement of transmission signals of the present embodiment in which a frequency is set in the ordinate thereof and a time is expressed on the abscissa thereof. In the present example, the frequency-axis and the time-axis are divided in a lattice fashion to provide an orthogonal base system. Specifically, the transmission band width of one transmission band (one band slot) is set to 150 KHz and the one transmission band of the 150 KHz includes therein 24 subcarriers. The twenty-four subcarriers are disposed continuously with an equal interval of 6.25 KHz, and every carrier is assigned with a subcarrier number from 0 to 23. However, practically existing subcarriers are allocated to bands of subcarrier numbers of 1 to 22. Bands of both end portions of the one band slot, i.e., bands of subcarrier numbers of 0 and 23 are assigned with no subcarrier, i.e., they are made to serve as a guard band and their electric power is set to zero.

One time slot is regulated at an interval of 200 $\mu$sec. in terms of the time-axis. A burst signal is modulated and transmitted together with 22 subcarriers at every time slot. One frame is defined as an array of 25 time slots (i.e., 5 msec.). Each of the time slots within one frame is assigned with a time slot number from 0 to 24. A hatched area in FIG. 8 represents a section of one time slot in one band slot. In this case, a time slot assigned with a slot number of 24 is a period in which no data is transmitted.

Multiple access in which a plurality of mobile stations (terminal apparatus) carry out communication with a base station at the same period, is carried out by using the orthogonal base system which derives from dividing the frequency-axis and time-axis in a lattice fashion. Connection condition with respective mobile stations is arranged as shown in FIGS. 9A to 9G. FIGS. 9A to 9G are diagrams each showing an operation condition indicating that how six mobile stations are connected to the base station by using time slots U0, U1, U2, . . . , U5 with one band slot (actually utilized band slot is changed owing to a frequency hopping which will be described later). A time slot represented by R is a reception slot while a time slot represented by T is a transmission slot. As shown in FIG. 9A, a frame timing regulated in the base station is set to a period including 24 time slots (of the 25 time slots, the last slot, i.e, a slot of number 24 is not utilized). In this case, the transmission slot is transmitted using a band different from one of the reception slot.

The mobile station U0 shown in FIG. 9B uses time slots of time slot numbers, 0, 6, 12, 18 within one frame as a reception slot, while time slots of time slot numbers, 3, 9, 15, 21 as a transmission slot. A burst signal is received or transmitted in each time slot. The mobile station U1 shown in FIG. 9C uses time slots of time slot numbers, 1, 7, 13, 19 within one frame as a reception slot, while time slots of time slot numbers, 4, 10, 16, 22 as a transmission slot. The mobile station U2 shown in FIG. 9D uses time slots of time slot numbers, 2, 8, 14, 20 within one frame as a reception slot, while time slots of time slot numbers, 5, 11, 17, 23 as a transmission slot. The mobile station U3 shown in FIG. 9E uses time slots of time slot numbers, 3, 9, 15, 21 within one frame as a reception slot, while time slots of time slot numbers, 0, 6, 12, 28 as a transmission slot. The mobile station U4 shown in FIG. 9F uses time slots of time slot numbers, 4, 10, 16, 22 within one frame as a reception slot, while time slots of time slot numbers, 1, 7, 13, 22 as a transmission slot. Further, the mobile station U5 shown in FIG. 9G uses time slots of time slot numbers, 5, 11, 16, 22 within one frame as a reception slot, while time slots of time slot numbers, 2, 8, 14, 20 as a transmission slot.

Since the arrangement shown in FIG. 9A to 9G is employed, six time-division multiple access (TDMA) in which six mobile stations accesses one band slot is carried out. In view of each of the mobile stations, there is a spare period of two time slots (i.e., 400 $\mu$sec.) from completion of reception or transmission of one time slot period to start of next transmission or reception. Each of the mobile stations carries out a timing processing and a processing called a frequency hopping by utilizing this spare period. Specifically, each of the mobile stations carries out a timing processing TA for agreeing a transmission timing with a timing of a signal transmitted from a base station during after 200 $\mu$sec. have passed before each transmission slot T, and carries out the frequency hopping for switching a band slot used for transmission and reception to another band slot after about 200 $\mu$sec. have passed since completion of each transmission slot T. Since the above timing is one used when the transmission rate is set high, if the transmission rate is set low and the number of the band slot to be used is changed, then it is necessary to set the timing for the frequency hopping again.

Specifically, a plurality of band slots are allocated to a single base station. In a case of a cellular system in which one base station forms one cell, if a band of 1.2 MHz is allocated to one cell, eight band slots can be allocated to one cell. Similarly, if a band of 2.4 MHz is allocated to one cell, 16 band slots can be allocated to one cell; if a band of 4.8 MHz is allocated to one cell, 32 band slots can be allocated to one cell; and if a band of 9.6 MHz is allocated to one cell, 64 band slots can be allocated to one cell. Then, a frequency switching processing called the frequency hopping is carried out so that a plurality of band slots allocated to one cell are utilized uniformly.

Figures 10A, 10B:
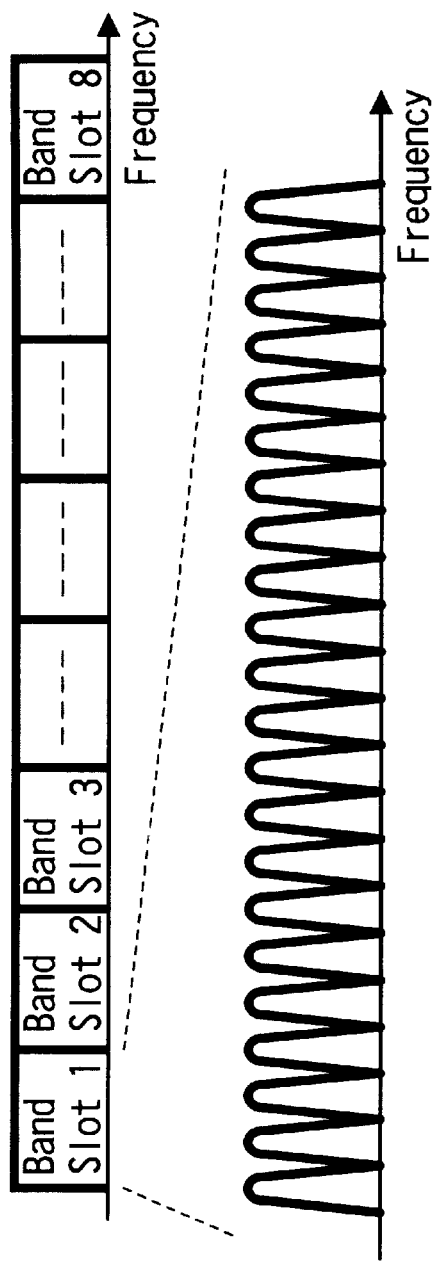
FIGS. 10A to 10B are diagrams used to explain a band slot of the communication system applied to the second embodiment.

FIGS. 10A and 10B are diagrams showing a system in which eight band slots are provided in one cell. Specifically, in each of the prepared eight band slots as shown in FIG. 10A, twenty-two carries are set as shown in FIG. 10B to carry out the data transmission.

The communication condition is settled as above so that a signal transmitted between each mobile station and the base station is maintained to have orthogonal property with respect to other signals. Therefore, the signal will not suffer from interference from other signals and only a corresponding signal can be extracted satisfactorily. Since a band slot utilized for transmission is changed at any time by the frequency hopping, the transmission bands prepared for each base station is effectively utilized, which leads to efficient transmission and improved resistance to a noise resulting from radio interference. In this case, as described above, a frequency band to be allocated to one base station (cell) can be freely settled. Therefore, a system can be freely settled depending on a used situation.

Next, arrangements of a base station and a terminal apparatus (mobile station or subscriber) used when communication is carried out between the base station and the terminal apparatus in the above-described system will be described. In this case, a band of 2.0 GHz is utilized as a down-link from the base station to the terminal apparatus while a band of 2.2 GHz is utilized as an up-link from the terminal apparatus to the base station.

Figure 11:
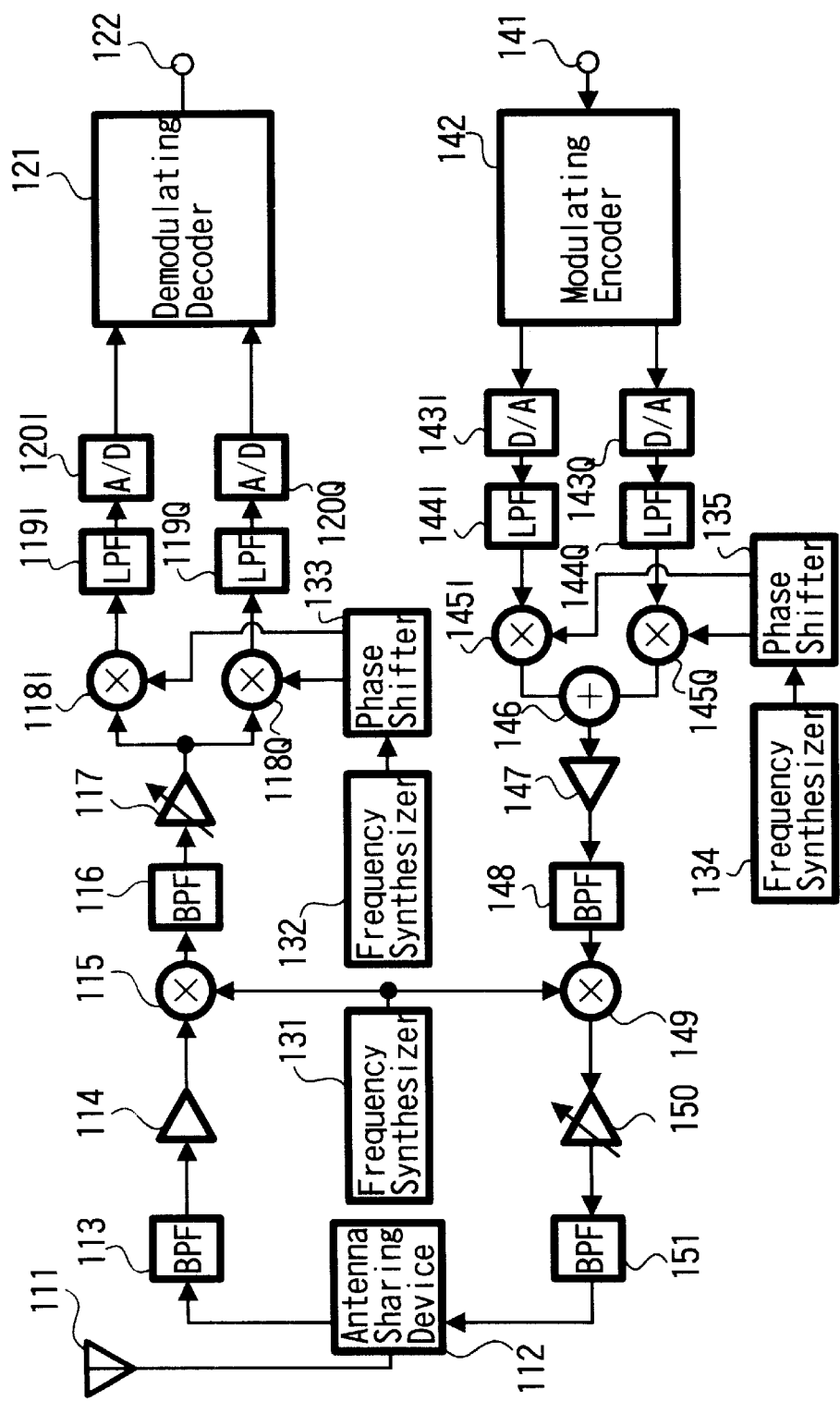
FIG. 11 is a block diagram showing an arrangement of a terminal apparatus according to the second embodiment.

FIG. 11 is a diagram showing an arrangement of the terminal apparatus. A reception system thereof will be described first. An antenna 111 serving for transmitting and receiving a signal is connected to an antenna sharing device. The antenna sharing device 112 is connected at its received signal output side with a band-pass filter 113, a reception amplifier 114 and a mixer 115 in series. The band-pass filter 13 extracts a signal of the 2.0 GHz band. The mixer 115 mixes the output from the band-pass filter with a frequency signal of 1.9 GHz output from a frequency synthesizer 131 so that the received signal is converted into an intermediate frequency signal of a 100 MHz. The frequency synthesizer 131 is formed of a PLL (phase•locked•loop circuit), and it is a synthesizer for generating signals in a band of 1.9 GHz with an interval of 150 kHz (i.e., one band slot interval).

The intermediate frequency signal output from the mixer 115 is supplied through a band-pass filter 16 and a variable gain amplifier 117 to two mixers 118I, 118Q useful for demodulation. A frequency signal of 100 MHz output from a frequency synthesizer 134 is supplied to a phase shifter 35 in which the signal is made into two system signals of which phases are shifted from each other by 90 degrees. One of the two-system frequency signals is supplied to the mixer 118I while the other of the same is supplied to the mixer 118Q so that they are mixed with the intermediate frequency signal respectively, whereby an I component and a Q component contained in the received data are extracted.

Then, the extracted I-component is supplied through a low-pass filter 119I to an analog-to-digital converter 120I in which the component is converted into digital I data. The extracted Q-component is supplied through a low-pass filter 119Q to an analog-to-digital converter 120Q in which the component is converted into digital Q data.

Then, the digital I data and digital Q data output from the analog-to-digital converters 120I, 120Q are supplied to a demodulating decoder 121 in which demodulated reception data is obtained at a terminal 122.

Next, the transmission system of the terminal apparatus will be described. Transmission data obtained at a terminal 141 is supplied to a modulating encoder 142 in which processing for encoding and modulation is carried out for transmission so as to generate digital I data and digital Q data for transmission. The digital I data and the digital Q data output from the modulating encoder 142 are supplied to digital-to-analog converters 143I and 143Q in which the data are converted into an analog I signal and an analog Q signal. The converted I signal and Q signal are supplied through low-pass filters 144I and 144Q to mixers 145I and 145Q. Further, a frequency signal of 300 MHz output from a frequency synthesizer 138 is converted by a phase shifter 1139 into two system signals of which phases are shifted from each other by 90 degrees. One of the two system frequency signals is supplied to the mixer 145I while the other of the same is supplied to the mixer 145Q, whereby the frequency signals are mixed with the I signal and the Q signal, respectively, so as to form signals falling in a 300 MHz band. Both of the signals are supplied to an adder 146 in which carried out is an orthogonal modulation to unify them into a single system signal.

Then, the signal modulated into the signal of 300 MHz band output from the adder 146 is supplied through a transmission amplifier 147 and a band-pass filter 148 to a mixer 49, in which the signal is added with a frequency signal of 1.9 GHz output from the frequency synthesizer 131 so as to convert the signal into a signal of a transmission frequency of 2.2 GHz band. The transmission signal frequency-converted into the transmission frequency is supplied through a transmission amplifier (variable gain amplifier) 150 and a band-pass filter 51 to the antenna sharing device 112 so that the signal is transmitted from the antenna 111 connected to the antenna sharing device 112 in a wireless fashion. A gain of the transmission amplifier 150 is controlled to thereby adjust a transmission output. The control in transmission output is carried out based on output control data received from the base station side, for example.

Figure 12:
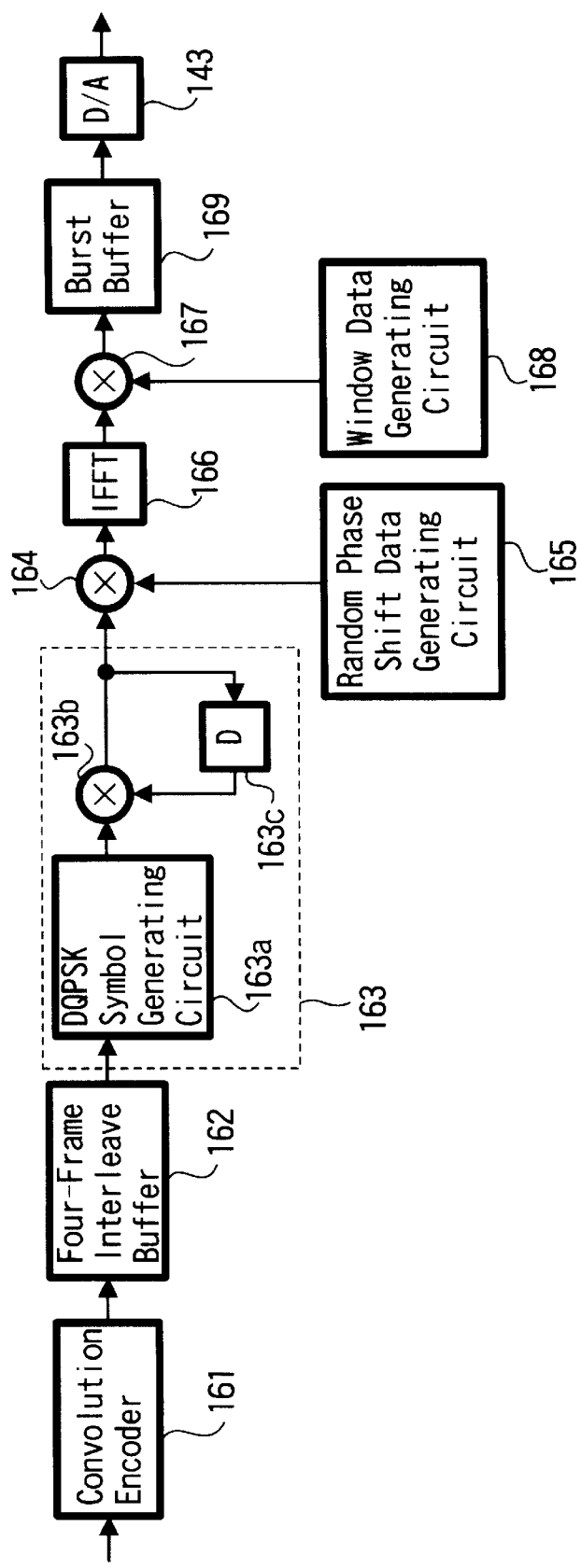
FIG. 12 is a block diagram showing an arrangement of an encoder of the terminal apparatus according to the second embodiment.
Figure 13:
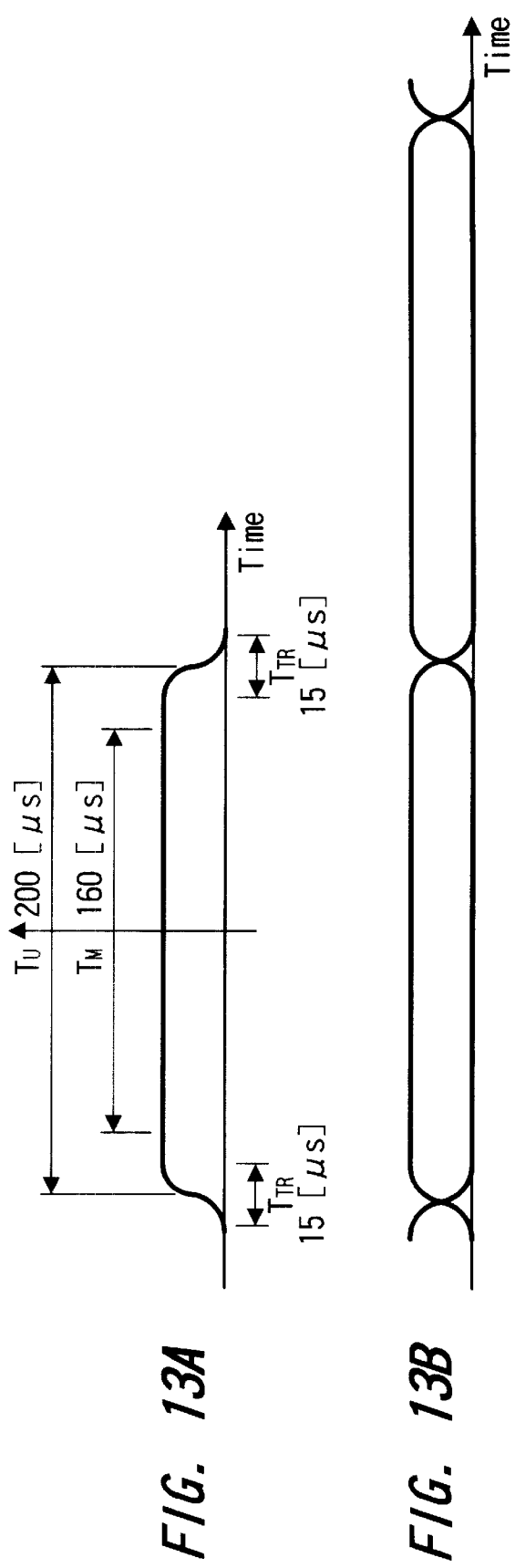
FIGS. 13A and 13B are diagrams used to explain a windowing data of the communication system according to the second embodiment.

Next, the encoder in the transmission system of the terminal apparatus of the arrangement and its peripheral arrangement will be described in detail with reference to FIG. 12. A convolution encoder 161 subjects a transmission data to convolution encoding. The convolution encoding is carried out with a constrained length of k=7 and a coding rate of R=⅓, for example. An output of the convolution encoder 161 is supplied to a four-frame interleave buffer 162 in which data interleave is carried out over four frames (20 msec.). An output of the interleave buffer 162 is supplied to a DQPSK encoder 163 in which a DQPSK modulation is carried out. That is, a DQPSK symbol generating circuit 163a generates a corresponding symbol based on supplied data, and then the symbol is supplied to a multiplier 163b at one input terminal thereof. A delay circuit 163c delays a multiplied output of the multiplier 112 by one symbol amount and returns it to the other input terminal thereof, whereby the DQPSK modulation is carried out. The DQPSK modulated data is supplied to a multiplier 164 so that random phase shift data output from a random phase shift data generating circuit 165 is multiplied with the modulated data, whereby phase of the data is apparently changed at random.

An output from the multiplier 164 is supplied to an inverse fast Fourier transformation (IFFT) circuit 166 in which a conversion processing to a time axis is carried out on the data of the frequency axis by calculation of the inverse fast Fourier transformation, whereby data on the real time axis of the multicarrier signal of 22 subcarriers with an interval of 6.25 kHz is produced.

The multicarrier data transformed into data of the real time by the inverse fast Fourier transformation is supplied to a multiplier 167 in which the data is multiplied with a time waveform output from a windowing data generating circuit 168. The time waveform is a waveform having one waveform length $T_u$, or about 200 μsec. (that is, one time slot period) as shown in FIG. 13A, for example, on the transmission side. However, the waveform is arranged to have its both end portions $T_{TR}$ (about 15 μsec.) changing gently in its waveform level. Hence, the neighboring time waveforms are arranged to overlap partly on each other as shown at FIG. 13B when the time waveform is utilized for multiplication.

The arrangement of the encoder will be described again with reference to FIG. 12. Transmission data added with the control data by the adder 167 is supplied to a digital-to-analog converter 143 (which corresponds to the digital-to-analog converters 143I, 143Q shown in FIG. 11) in which the transmission data is converted into an analog signal using a clock of 200 kHz for conversion.

Figure 14:
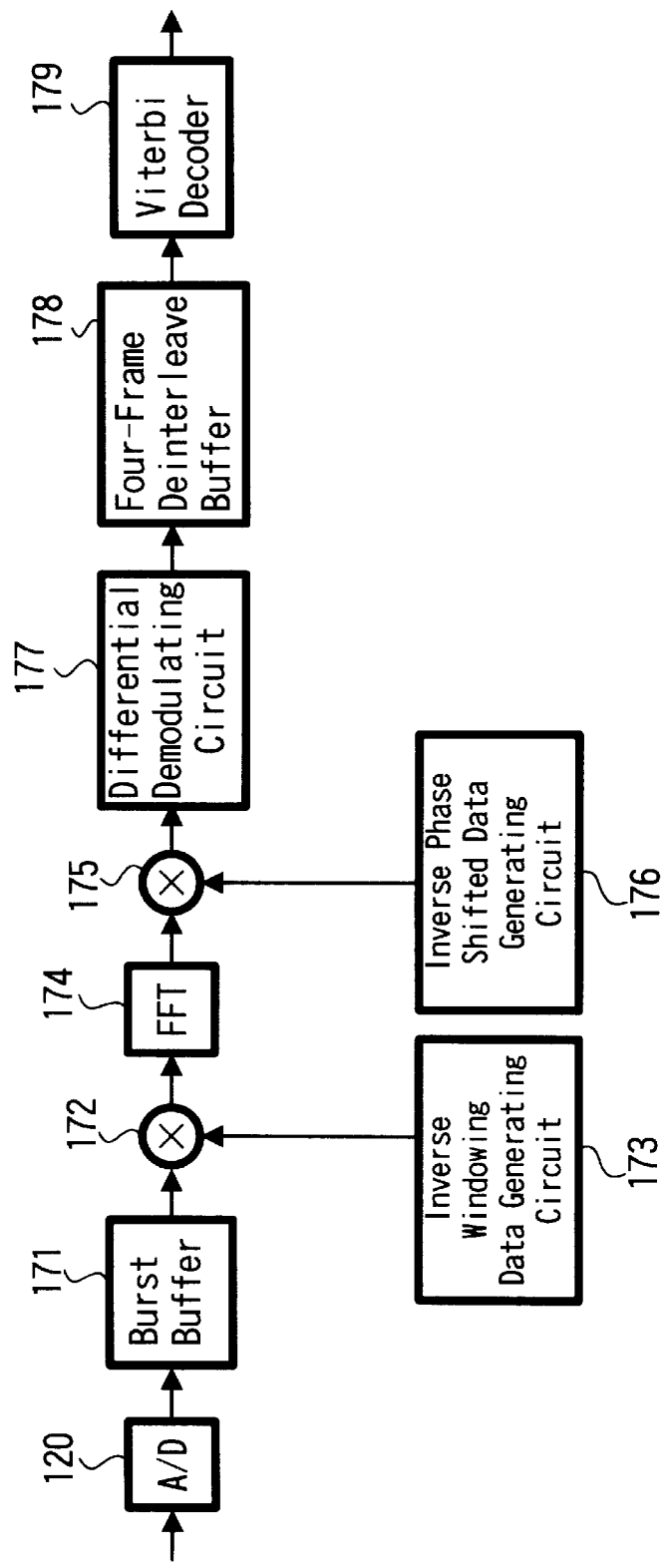
FIG. 14 is a block diagram showing an arrangement of a decoder of the terminal apparatus according to the second embodiment.

Next, the decoder and the peripheral arrangement thereof of the reception system of the terminal apparatus of the present example will be described in detail with reference to FIG. 14. Digital data resulting from conversion by an analog-to-digital converter 120 (corresponding to the analog-to-digital converters 120I, 120Q in FIG. 11) using a clock of 200 kHz, is supplied through a burst buffer 171 to a multiplier 172, in which the digital data is multiplied with a time waveform output from an inverse windowing data generating circuit 173. The time waveform utilized for multiplication upon reception is a time waveform with a shape shown in FIG. 13A. This time waveform is arranged to have a length, $T_M$, i.e., 160 μsec. which is shorter than the length of the same upon transmission.

The reception data multiplied with the time waveform is supplied to a FFT circuit 134 in which conversion between a frequency axis and a timebase is carried out by the fast Fourier transformation processing, whereby the transmitted data modulated into 22 subcarriers with an interval of 6.25 kHz and arranged on the time base are separated into information component which each carrier has.

The reception data which has been subjected to the fast Fourier transformation in the FFT circuit 174 is supplied to a multiplier 175, in which the reception data is multiplied with inverse random phase shift data (this data is data changing in synchronism with random phase shift data on the transmission side) output from an inverse random phase shift data generating circuit 176, whereby the data is restored to have its original phase.

The data restored to have its original phase is supplied to a differential demodulation circuit 177 in which the data is subjected to differential demodulation. The differentially demodulated data is supplied to a four-frame de-interleave buffer 178 in which data interleaved over four frames upon transmission is restored to have its original data order. The deinterleaved data is supplied to a Viterbi decoder 139 in which the data is Viterbi-decoded. The Viterbi-decoded data is supplied as decoded reception data to a reception data processing circuit (not shown) placed in the later stage.

Figure 15:
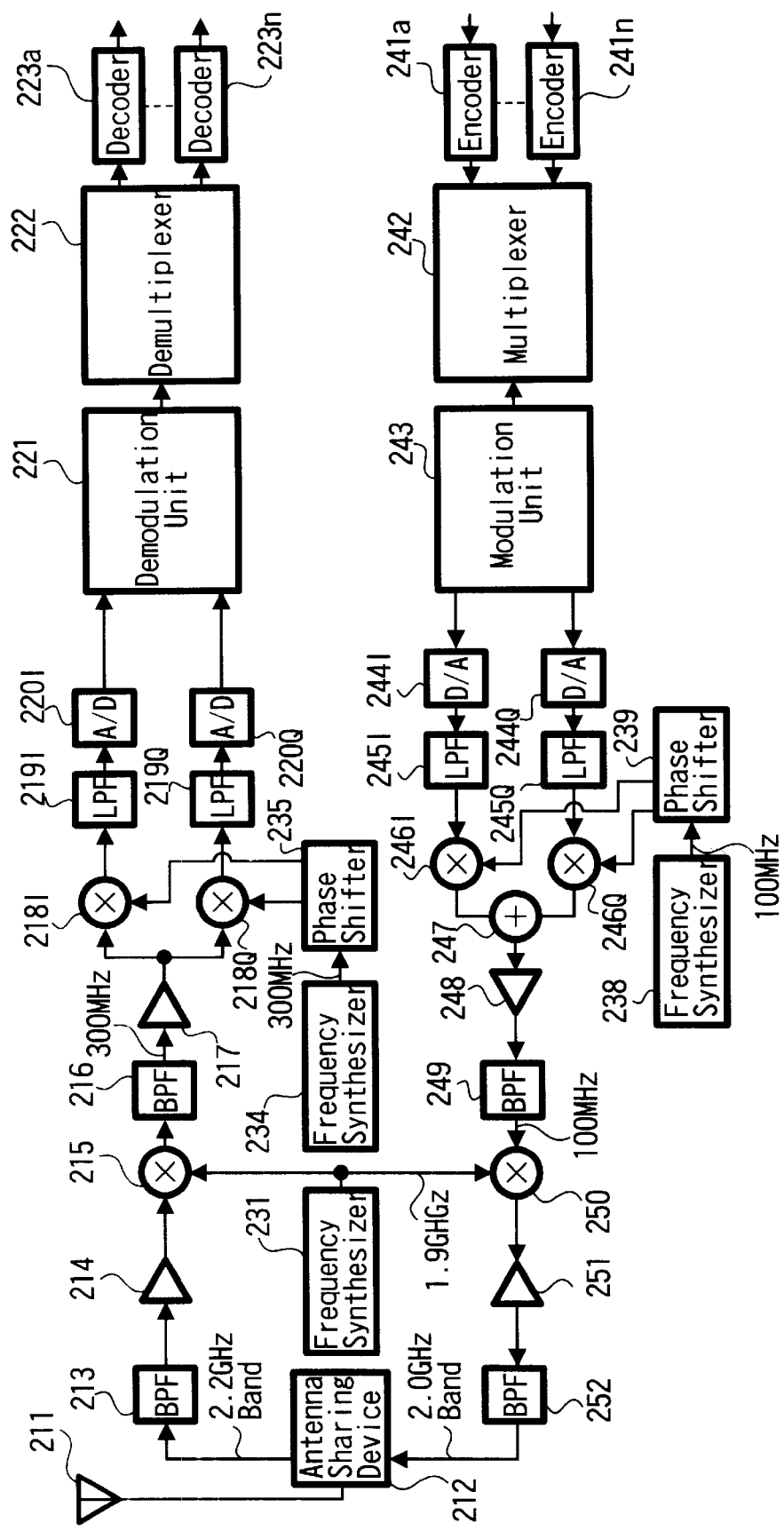
FIG. 15 is a block diagram showing an arrangement of a base station according to the second embodiment.

An arrangement of the base station will subsequently be described with reference to FIG. 15. The arrangement of the base station for transmitting and receiving data is basically the same as that of the terminal apparatus, but it is different therefrom in that it has an arrangement for carrying out the multiple access in which it is simultaneously connected to a plurality of terminal apparatus.

Initially, an arrangement of the reception system shown in FIG. 15 will be described. An antenna 211 serving for transmission and reception is connected to an antenna sharing device 212. The antenna sharing device 212 is connected at its reception signal output side with a band-pass filter 213, a reception amplifier 214 and a mixer 215 in series. The band-pass filter 213 extracts 2.2 GHz band. The mixer 215 mixes an extracted signal with a frequency signal of 1.9 GHz output from a frequency synthesizer 231 so that a reception signal is converted into an intermediate signal of 300 MHz band.

The intermediate frequency signal output from the mixer 215 is supplied through a band-pass filter 216 and a reception amplifier 217 to two mixers 218I, 218Q useful for demodulation. A frequency signal of 300 MHz output from a frequency synthesizer 234 is converted into signals of two systems of which phases are shifted from each other by 90 degrees by a phase shifter 235. One of the two system frequency signals is supplied to the mixer 218I while the other of the same is supplied to the mixer 218Q so that they are mixed with the intermediate frequency signals, respectively. Thus, an I-component and a Q-component contained in the received data are extracted.

The extracted I-component is supplied through a low-pass filter 219I to an analog-to-digital converter 220I in which the component is converted into digital I data. The extracted Q-component is supplied through a low-pass filter 219Q to an analog-to-digital converter 220Q in which the component is converted into digital Q data.

Then, the digital I data and the digital Q data output from the analog-to-digital converters 220I, 220Q are supplied to a demodulating unit 221 from which demodulated data is supplied to a demultiplexer 222, in which the data supplied thereto is classified into data from respective terminal apparatus and the classified data are supplied separately to decoders 223a, 223b, . . . , 223n of which number corresponds to a number of terminal apparatus permitted to access at a time (six terminals per one band slot).

Next, an arrangement of a transmission system of the base station will be described. A multiplexer 242 synthesizes transmission data which are separately encoded by encoders 241a, 241b, . . . , 241n prepared for respective opponents (terminal apparatus) capable of communicating at a time. An output of the multiplexer 242 is supplied to a modulation unit 243 in which modulation processing for transmission is carried out, whereby digital I data and digital Q data for transmission are generated.

The digital I data and the digital Q data output from the modulation unit 243 are supplied to digital-to-analog converters 244I and 244Q in which the digital data are converted into an analog I signal and an analog Q signal. The converted I signal and Q signal are supplied through low-pass filters 245I and 245Q to mixers 246I and 246Q. Further, a frequency signal of 100 MHz output from a frequency synthesizer 238 is converted by a phase shifter 239 into two system signals of which phases are shifted from each other by 90 degrees. One of the two system frequency signals is supplied to the mixer 246I while the other of the same is supplied to the mixer 246Q, whereby the frequency signals are mixed with the I signal and the Q signal, respectively, so as to form signals falling in a 300 MHz band. Both of the signals are supplied to an adder 247 in which carried out is an orthogonal modulation to unify them into a single system signal.

Then, the signal modulated into the signal of 100 MHz band output from the adder 247 is supplied through a transmission amplifier 248 and a band-pass filter 249 to a mixer 250, in which the signal is added with a frequency signal of 1.9 GHz band output from the frequency synthesizer 231 so as to convert the signal into a signal of a transmission frequency of 2.0 GHz band. The transmission signal frequency-converted into the transmission frequency is supplied through a transmission amplifier 251 and a band-pass filter 252 to the antenna sharing device 212 so that the signal is transmitted from the antenna 211 connected to the antenna sharing device 212 in a wireless fashion.

Figure 16:
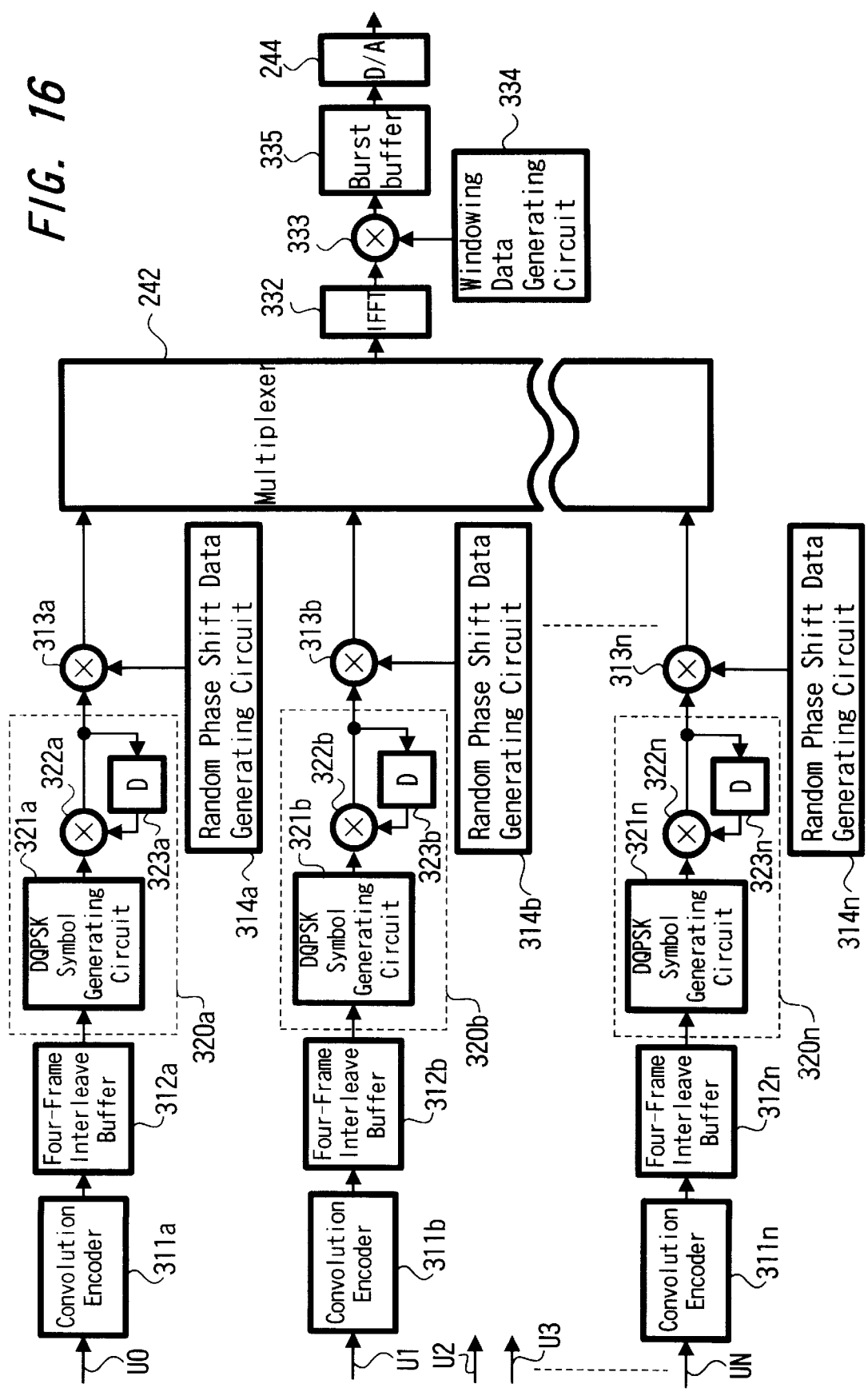
FIG. 16 is a block diagram showing an arrangement of a modulation processing unit of the base station according to the second embodiment.

Next, an arrangement of the base station for encoding and modulating transmission data will be described in detail with reference to FIG. 16. In this case, it is supposed that N (N is an arbitrary number) terminal apparatus (users) carry out multiple access at a time. Thus, convolution encoders 311a, 311b, . . . , 311n subjects transmission signals U0, U1, . . . , UN to respective users of the terminal apparatus to convolution encoding, respectively. The convolution encoding is carried out with a constraint length k=7 and a coding rate R=⅓, for example.

Then, data convolution-encoded by respective systems are supplied to four-frame interleave buffers 312a, 312b, . . . , 312n, respectively, in each of which interleave is carried out on data over four frames (20 msec.). Outputs of respective interleave buffers 312a, 312b, . . . , 312n are supplied to DQPSK encoders 320a, 320b, . . . , 320n, respectively, in each of which DQPSK modulation is carried out. Specifically, DQPSK symbol generating circuits 321a, 321b, . . . , 321n generates corresponding symbols based on the supplied data. The symbols are supplied to one input of multipliers 322a, 322b, . . . , 322n, and multiplied outputs of the multipliers 322a, 322b, . . . , 322n are supplied to respective delay circuits 323a, 323b, . . . , 323n in each of which the symbol is delayed by one symbol amount and fed back to the other input. Thus, DQPSK modulation is carried out. Then, the data subjected to the DQPSK modulation are supplied to the multipliers 313a, 313b, . . . , 313n, respectively, in which random phase shift data separately output from random phase shift data generating circuit 314a, 314b, . . . , 314n are multiplied with modulation data. Thus, respective data are changed in phase at random apparently.

Outputs of the respective multipliers 313a, 313b, . . . , 313n are supplied to a multiplexer 242 and then synthesized thereby. When the transmission data are synthesized by the multiplexer 242 according to this embodiment, a frequency at which the transmission data are synthesized can be switched by a unit of 150 kHz. By the switching control, the frequency of the burst signal supplied to each terminal apparatus is switched. Specifically, in this embodiment, as described with reference to FIGS. 9A to 9G and so on, an operation of switching a frequency by a band slot unit which is called a frequency hopping is carried out, and the frequency switching operation is realized by switching processings of the multiplexer 242 upon the synthesizing operation.

The data synthesized by the multiplexer 242 is supplied to an IFFT circuit 332 which carries out the inverse fast Fourier transform for the data, and then obtains a so-called multicarrier data modulated so as to have twenty two subcarriers having frequencies at every 6.25 kHz per one band slot and converted into the real time. Then, the data converted into the real time signal by the inverse fast Fourier transform is supplied to a multiplier 333 which multiplies it with a time waveform output from a windowing data generating circuit 334. As shown in FIG. 13A, for example, the time wave form is a waveform whose length $T_U$ of one waveform is about 200 $\mu$second (i.e., one time slot period). However, at each of its both end portions $T_{TR}$ thereof (about 15 $\mu$second), a level of the waveform is smoothly changed. When the waveform is multiplied with the time wave form as shown in FIG. 13B, adjacent time waveforms are partially overlapped with each other.

Then, the signal multiplied with the time waveform by the multiplier 333 is supplied through a burst buffer 335 to a digital/analog converter 244 (corresponding to the converters 244I, 244Q shown in FIG. 15) which converts it into an analog I signal and an analog Q signal. Then, the analog signals are processed for transmission in the arrangement shown in FIG. 15.

Figure 17:
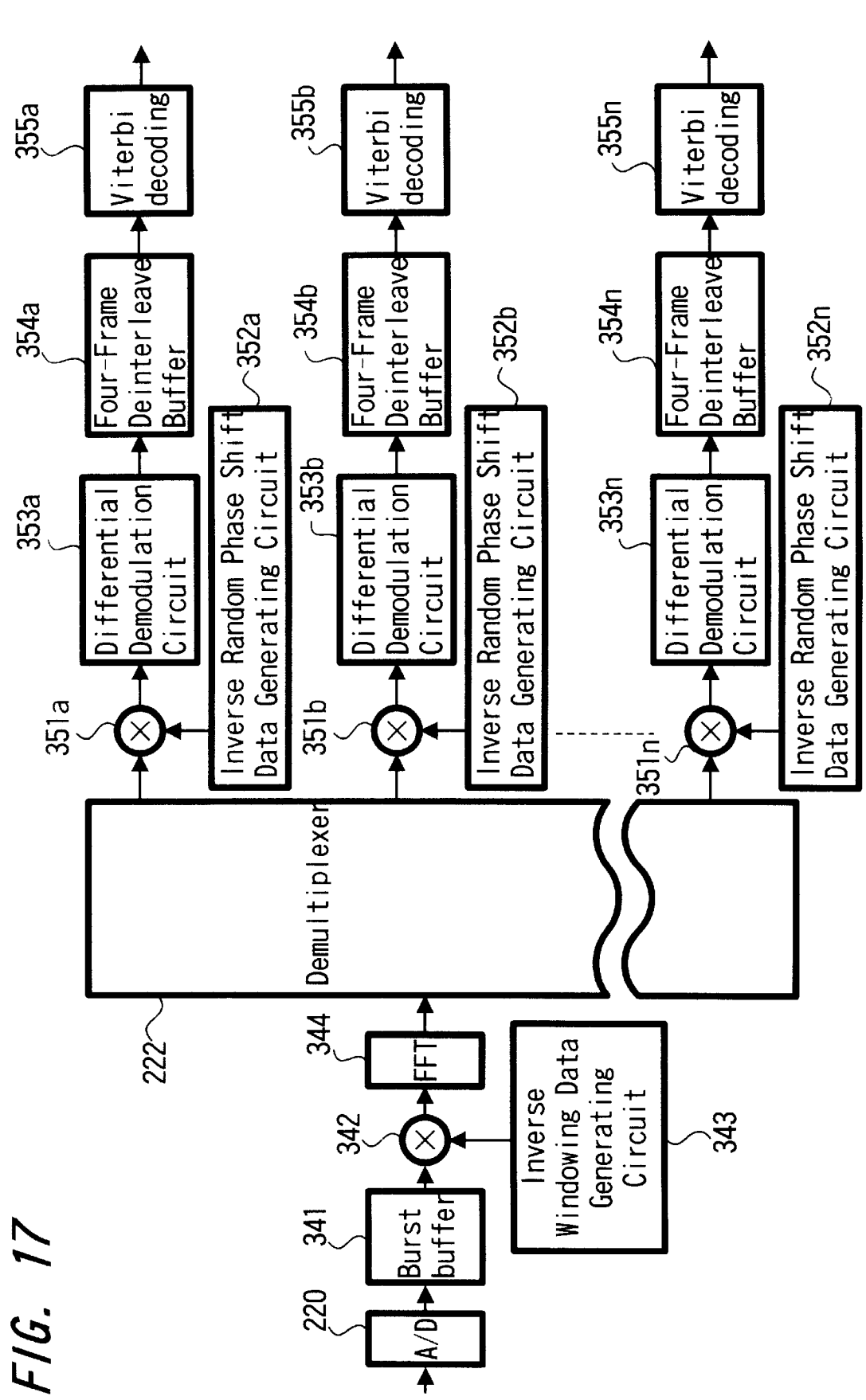
FIG. 17 is a block diagram showing an arrangement of a demodulation processing unit of the base station according to the second embodiment.

An arrangement for demodulating received data in the base station to decode it will be described in detail with reference to FIG. 17. A digital I data and a digital Q data converted by an analog/digital converter 220 (corresponding to the analog/digital converters 220I and 220Q in FIG. 15) are supplied through a burst buffer 341 to a multiplier 342. The multiplier multiplies them with a time waveform output from an inverse windowing data generating circuit 343. The time waveform is a time waveform having a shape shown in FIGS. 13A and 13B and also a time waveform having a length $T_M$ of 160 $\mu$sec which is shorter than that used upon transmission.

The received data multiplied with the time waveform is supplied to a FFT circuit 344 and subjected to fast Fourier transform thereby to carry out a processing converting a frequency axis into a time axis. Thus, each of the data transmitted after modulation in the form of 22 subcarriers at an interval of 6.25 kHz per one band slot is obtained from the real time signal. Then, the data subjected to the fast Fourier transform is supplied to a demultiplexer 222 and divided into data which is as much as the terminal apparatus permitted in multiple access to the base station simultaneously. When the data is divided by the demultiplexer 222 according to this embodiment, the frequency used for the above division is switch ed by a unit of 150 kHz and this switching operation is controlled, thereby frequencies of the burst signals transmitted from the respective terminal apparatus being switched. Specifically, in this embodiment, as described with reference to FIG. 9 and so on, the operation of switching the frequency of a band slot unit which is called the frequency hopping is carried out periodically, and the frequency switching operation carried out on the reception side is realized by time-dividing processings of the demultiplexer 222 upon reception of the received data.

The respective received data divided by the demultiplexer 222 are independently supplied to multiplexers 351a, 351b, . . . , 351n provided so as to be as much as the terminal apparatus of the number N permitted in simultaneous multiple access to the base station. The multipliers 351a, 351b, . . . , 351n respectively multiply the divided data with inverse random phase shift data (data changed in synchronization with the random phase shift data on the transmission side) output from the inverse random phase shift data generating circuits 352a, 352b, . . . , 352n and returns the received divided data to the data having the original phases in the respective systems.

The respective data from the inverse random phase shift data generating circuits are supplied to delay detection circuits 353a, 353b, . . . , 353n and delay-detected (differentially demodulated) thereby. The delay detection circuits supplies the delay detected data to four-frame interleave buffers 354a, 354b, . . . , 354n which restores the data of four frames interleaved upon transmission to the data of the original data arrangement. The four-frame interleave buffers supply the de-interleaved data to Viterbi decoders 355a, 355b, . . . , 355n for subjecting them to Viterbi decoding. The decoders supply the data subjected to the Viterbi decoding as the received data to received-data processing circuits (not shown) at the succeeding stages.

In the above communication processings, the convolutional encoding and the Viterbi decoding are applied to the encoding and decoding processings, respectively. These encoding and decoding processings have been described by way of example. Therefore, the present invention is not limited to these encoding and decoding systems. An encoding processing for processing for setting a larger distance between transmission symbol series may be employed, and a decoding processing for carrying out a most likelihood series estimation based on a reception symbol may be employed. Specifically, a known turbo code and so on can also be employed.

A communication state presented when the communication between the terminal apparatus and the base station described above is carried out will be described. IN this embodiment, the transmission capacity used when the communication is carried out between the terminal apparatus and the base station can be adaptively set and a system for transmitting the multicarrier signal is applied to the processing for adaptively setting the transmission capacity.

Figure 18A:
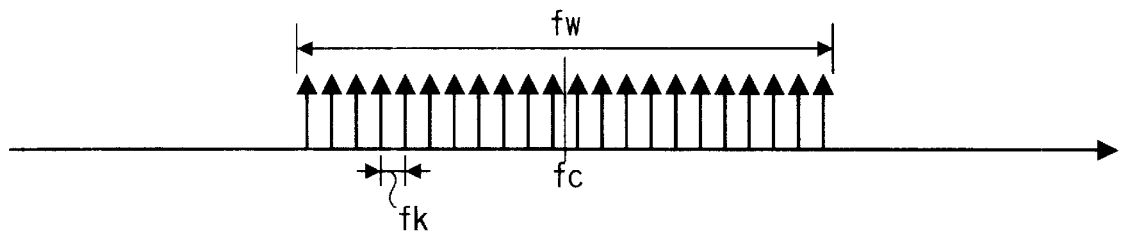
FIGS. 18A and 18B are diagrams used to explain a transmission state according to the second embodiment.

In this embodiment, as described above with reference to FIG. 8 and so on, the communication circuit usually set between the terminal apparatus and the base station is set by providing twenty-two subcarriers in one slot at a constant frequency interval, and a communication circuit of one unit is set by using one band slot, wherein the audio data and so on are transmitted. FIG. 18A shows a state of transmitting the twenty-two subcarriers by using a band fw of one band slot, in which fc and fk respectively depict a center frequency and a frequency interval between adjacent subcarriers (an interval of 6.25 kHz).

Figure 18B:
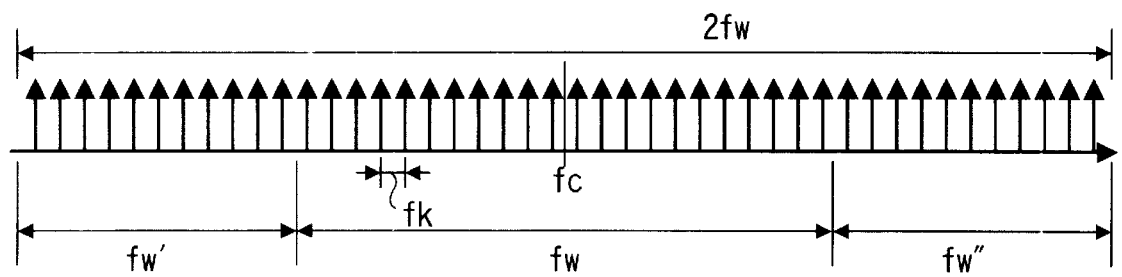

It is assumed that a request to increase a transmission capacity of information to be transmitted (i.e., a request to increase a transmission speed) is issued in a state that the communication circuit is set. At this time, if an adjacent band slot is a free slot, then the free band slot is added and allocated to the communication circuit, thereby, as shown in FIG. 18B, forty-four subcarriers being transmitted by using a band 2 fw of two band slots. The frequency interval fk between adjacent subcarriers is the same as that presented upon use of one slot. A center frequency fc presented upon use of two band slots may be set the same as a frequency presented upon use of one band slot or may be changed in response to a band of two band slots.

When the band of two slots is used as described above, as shown in FIG. 18B, data transmitted by twenty-two subcarriers in a band fw at the center portion around the center frequency fc are set as the data of the channel 1, and data transmitted by twenty-two subcarriers in bands fw' and fw" located on the upper and lower side of the band fw are set as the data of the channel 2. In the connection sequence processing shown in FIG. 5 (described in the first embodiment), while the data is transmitted, the processing for adding the channel 2 (the bands fw' and fw") is carried out.

Specifically, this processing will be described with reference to FIG. 5 again. Communication on the channel 1 (CH1) is a continuous communication (communication shown by a solid line in FIG. 5) using the subcarriers in the band fw, the communication on the channel 2 (CH2) is a newly added communication using the bands fw' and fw". It is assumed that while the communication on the channel 1 is being carried out, increase of the transmission capacity is demanded because the terminal apparatus starts transmitting a new information. At this time, the terminal apparatus transmits the request signal S101 for requesting the base station to create the new information channel to the base station by using a predetermined period in the channel 1 of the up-link circuit which is being used for communication.

When receiving the request signal S101 for requesting generation of the new information channel, the base station detects a free band slot and transmits a signal indicative of acceptance of opening a new channel in the free band slot and a signal S102 indicative of parameters changed in accordance with the acceptance. When receiving and confirming the signal indicative of the acceptance and so on, the terminal apparatus transmits an acknowledge (ACK) signal S103 by using the time slot T1 of the up-link circuit.

The parameters transmitted from the base station includes not only data about a band allocated as a new channel but also data of a timing at which communication is started in the band. In this case, at the timing indicated by the data, the communication is changed to a communication using two continuous band slots.

At the timing indicated by the data, the base station starts transmitting a header information signal by using the newly allocated bands fw' and fw" of the down-link circuit, and the terminal apparatus starts transmitting a header information signal by using the newly allocated bands fw' and fw" of the up-link circuit (these processings are indicated by reference number S104 in FIG. 5). The information such as the audio data or the like is continuously transmitted by using the band fw in each of frames. The header information signal is a predetermined signal formed of data having a specific pattern.

When the bidirectional transmission S104 of the header information signal by using the newly allocated bands fw' and fw" is started, a reception-side control unit determines whether or not the header information signal can be correctly received. If it is determined that the header information signal is received correctly, the reception-side control unit transmits an acknowledge signal S105 to the transmission side by using a predetermined period. When both sides receives and discriminates the acknowledge signals S105, the transmission of the information by using the newly allocated channel 2, and a communication circuit between the base station and one terminal apparatus is set. When information is transmitted by using the channels T1 and T2, information of the same kind may be transmitted with being divided into two for the two time slots T1 and T2 or informations of different kinds (e.g., an audio data and an electronic mail data) may be transmitted by using the two channels 1 and 2, respectively.

A processing of changing a transmission capacity to the original transmission capacity (a processing of reducing a transmission capacity when a transmission circuit using two channels is initially set) will be described. When the transmission capacity is reduced in accordance with the request from the terminal apparatus, as shown in FIG. 5, the terminal apparatus transmits a request signal S106 used for requesting the base station to open the channel 2 to the base station by using the channel 2 in the up-link circuit. When the base station receives the opening request signal S106 and its control unit confirms it, the base station transmits an acknowledge signal and a signal S107 indicative of parameters to be changed to the terminal apparatus by using the time slot T2 of the down-link circuit. After transmitting the signal S107 indicative of the parameters to be changed, the base station transmits a signal S108 for designating the number of a slot to be freed to the terminal apparatus as a trailer information signal used for freeing the circuit by using the channel 2 of the down-link circuit. When the terminal apparatus receives the signal S108 and its control unit confirms it, the terminal apparatus transmits an acknowledge signal (ACK signal) S109 to the base station by using the channel 2 of the up-link circuit and terminates the communication using the channel 2, thereby freeing the communication circuit using the channel 2. Thereafter, only the communication circuit using the channel 1 is still carried out, and hence the communication circuit is set in a state shown in FIG. 4A.

An interleaving processing and a de-interleaving processing applied to the communication processing according to this embodiment for thus changing the transmission capacity will be described. Two processings, i.e., a processing for changing the interleaving processing between those carried out before and after the number of the channel is increased to thereby increase the transmission capacity and a processing for independently setting the interleaving processing for each channel will be described.

Figures 20A, 20B, 20C:
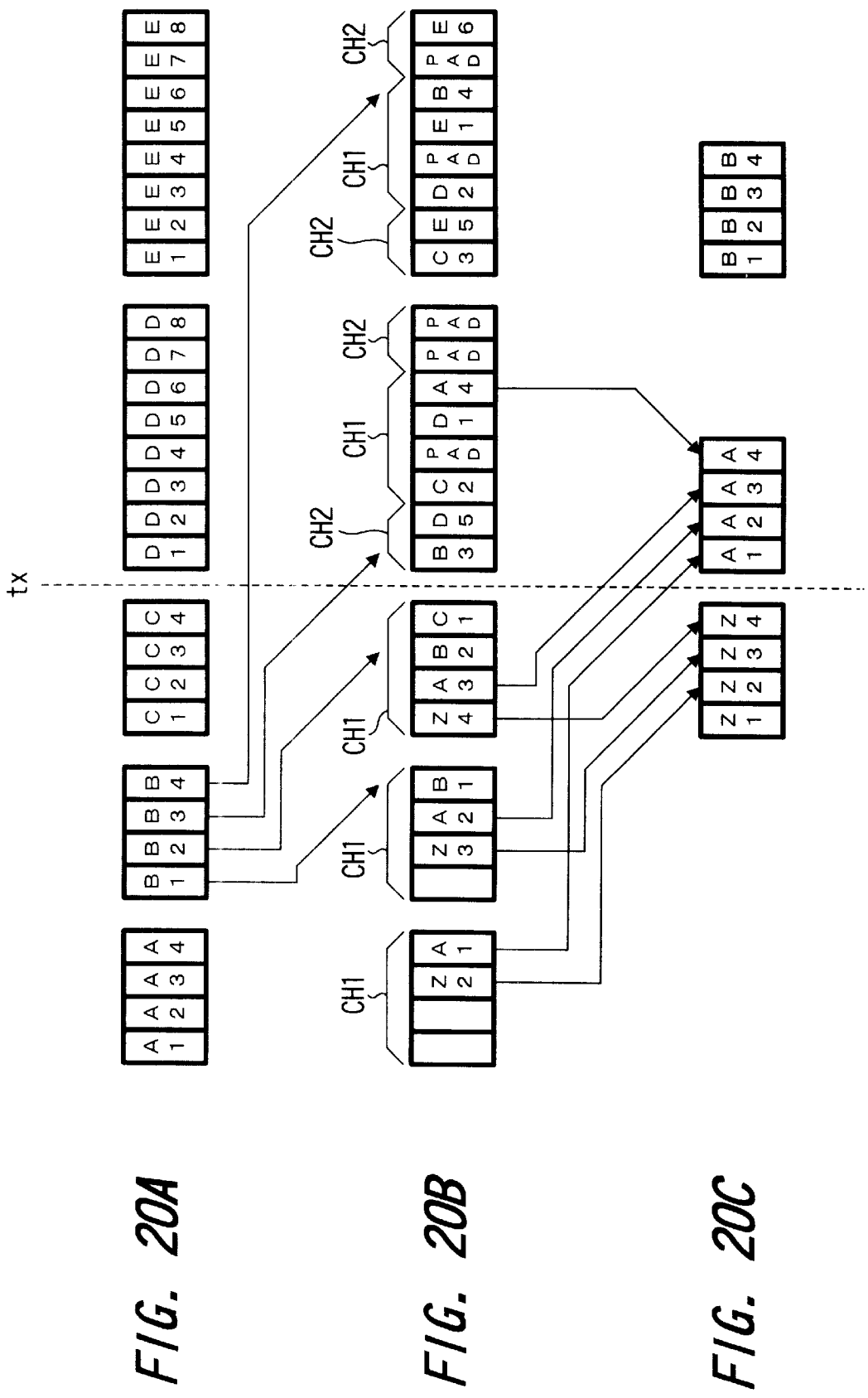
FIGS. 20A to 20C are diagrams used to explain an interleaving processing according to the second embodiment (in which an interleaving processing is changed in response to increase of channels)

The processing for changing the interleaving processing in response to the change of the transmission capacity will be described with reference to FIGS. 20A to 20C. In FIGS.

20A to 20C, the communication is carried out on the assumption that the transmission capacity is changed at the timing $t_x$ and that the communication circuit using only the channel 1 (subcarriers in a band fw) is set before the timing $t_x$ and the communication circuit using the channel 2 (subcarriers in the bands fw', fw") is set after the timing $t_x$. In this case, it is assumed that an interleaving processing for dispersing data of one frame in four frames is carried out and data obtained before the interleaving processing on the transmission side is the data shown in FIG. 20A. Specifically, in a certain frame which is being used for communication by using only one frame, while the data A1, A2, A3, A4 are transmission data in one time slot period, the interleaving processing on the transmission side disperses the data A1 to A4 in slots of another frame periods as shown in FIG. 20B. Then, the interleaved data is modulated and transmitted.

The reception side carries out the de-interleaving processing for restoring the arrangement of the transmitted data dispersed in the four frame periods of the channel 1 to its original data arrangement, thereby obtaining data of a slot configuration of the original data arrangement.

After the timing $t_x$, the amount of the data transmitted in one frame becomes double and hence the data are transmitted by using two time slot periods. For example, in a frame immediately after the timing $t_x$, transmission data D1, D2, . . . , D8 in two slot periods are generated as shown in FIG. 20A. The data D1 to D8 of two time slot periods forming one frame is processed as data of one series and subjected to the interleaving processing for dispersing the data D1 to D8 in four frames of two channels. As shown in FIG. 20B, interleaved transmission data of each frame is transmitted with being divided into two parts for the channel 1 (band fw) and the channel 2 (bands fw' and fw").

The bands fw' and fw" forming the channel 2 are bands added to a higher and lower regions of the band fw of the channel 1. If an abscissa of FIG. 20B is a frequency, then it can be considered that the data of one channel amount at the center in the interleaved data of the two channel amounts in one frame (e.g., the data C2, PAD, D1, A4 immediately after the timing $t_x$) are transmitted as the data of the channel 1, and the data of one channel amount provided at the preceding and succeeding positions thereof (e.g., the data B3, D5, PAD, PAD) immediately after the timing $t_x$) are transmitted as the data of the channel 2 of the subcarriers higher and lower than that of the channel 1. A data PAD in the transmission data shown in FIG. 20B depicts a period when the data is not transmitted (practically in this period some dummy data is transmitted or a transmission power is set to 00 and a period when, immediately after the number of the channel is increased, there is no data to be transmitted in a channel newly added. In FIG. 20B, a precise expression may be different depending upon whether the abscissa is set as time or a frequency. However, FIG. 20B schematically shows the state including such periods.

The data thus interleaved and transmitted is subjected to the de-interleaving processing for de-interleaving the received data of eight time slots in four frames, thereby being restored to its original data arrangement. Then, the data of two time slots is extracted from received data of every frame. FIG. 6 is a simplified diagram used to explain outlines of the interleaving processing and the de-interleaving processing. In the actual interleaving and de-interleaving processings, the data are arranged in more complicated manner.

Since the number of channels to be simultaneously transmitted is increased and at the same time the interleaving processing and the de-interleaving processing are switched to those corresponding to the transmission capacity of the increased channels, it is easy to carry out the processings in response to increase of the channel number. When the number of channel is reduced, the interleaving processing and the de-interleaving processing can be carried out satisfactorily by switching them in a manner reverse to the example shown in FIGS. 20A and 20B.

Figures 21A, 21B, 21C:
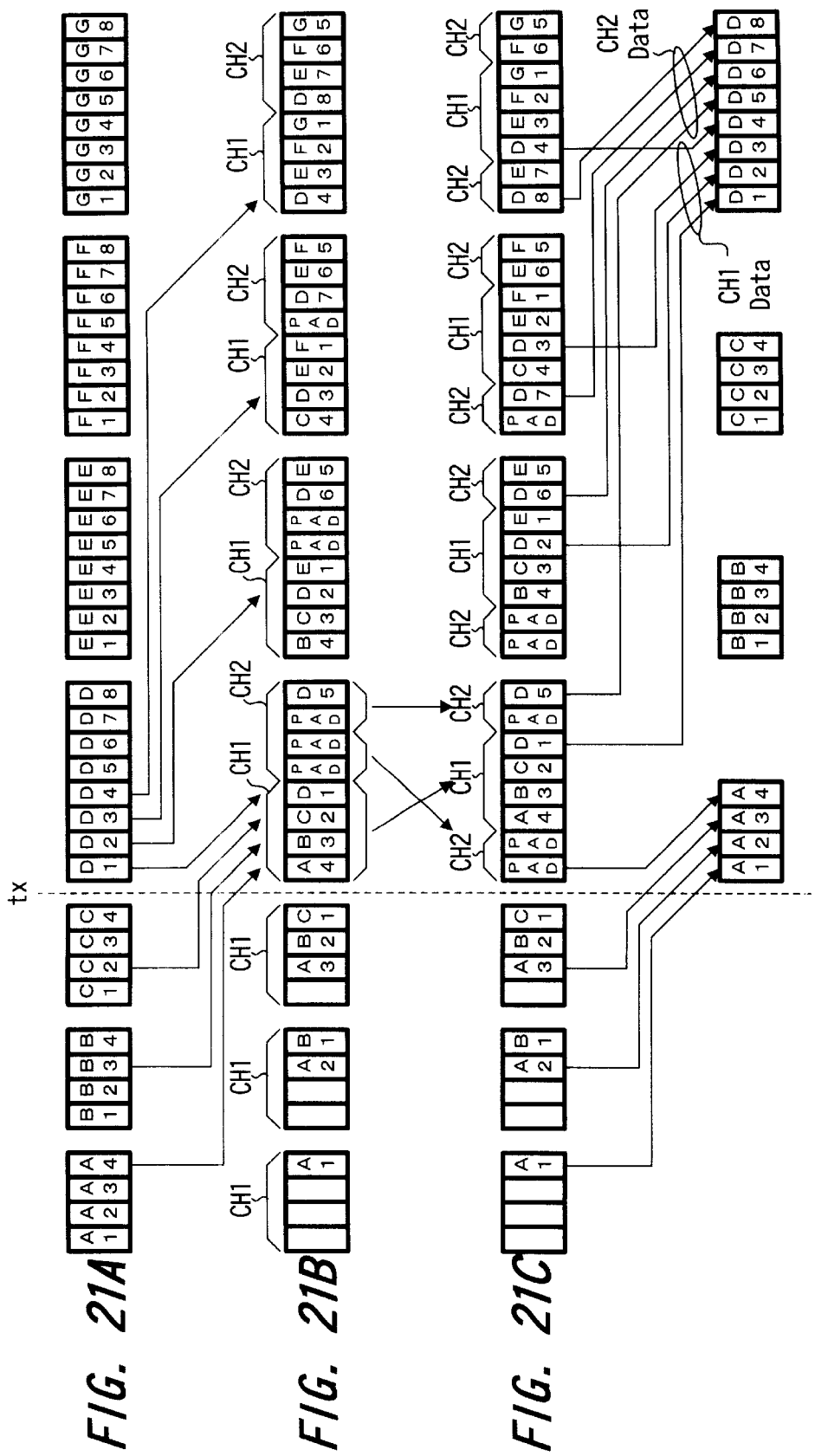
FIGS. 21A to 21C are diagrams used to explain an interleaving processing according to the second embodiment (in which an interleaving processing is independently carried out for each of channels).

Another interleaving processing for individually setting the interleaving processings for each channel even when the new channel is added will be described with reference to FIGS. 21A to 21C. In FIGS. 21A to 21C, the communication is carried out on the assumption that the transmission capacity is changed at the timing $t_x$ and that the communication circuit using only the channel 1 (band fw) is set before the timing $t_x$ and the communication circuit using the channels 1 and 2 (bands fw' and fw") is set after the timing $t_x$. In this case, it is assumed that an interleaving processing for dispersing data of one frame in four frames is carried out.

Specifically, FIG. 21A shows the data which is obtained before the interleaving processing on the transmission side. FIG. 21B shows the interleaved data, and FIG. 21C shows a transmission data obtained by arranging the data shown in FIG. 21B based on the channel arrangement. The data is dispersed in four frames in each channel. If the communication circuit using only the channel 1 is set, then the interleaved data shown in FIG. 21B and the data shown in FIG. 21C arranged based on the channel arrangement are the data having the same arrangement. FIG. 21C also shows data restored by the de-interleaving processing, showing a data of one frame is restored from the data dispersed in four frames. The interleaving state before the timing $t_x$ is similar to that described with reference to FIGS. 20A to 20C.

After the channel 2 (bands fw' and fw") is added at the timing $t_x$, the transmission data of the channel 1 and the channel 2 are independently subjected to the interleaving processings. Specifically, a data (e.g., data D1 to D4 of a frame immediately after the timing $t_x$) of the first half of the transmission data of two slots amount of one frame after the timing $t_x$ are, as shown in FIG. 21B, dispersed in slots transmitted by using the channel 1 and then interleaved. A data (e.g., data D5 to D8 of a frame immediately after the timing $t_x$) of the second half of the transmission data of two slots amount of one frame are, as shown in FIG. 21B, dispersed in slots transmitted by using the channel 2 and then interleaved.

The data interleaved individually with respect to each channel are arranged in accordance with the data arrangement corresponding to a practical channel arrangement. Specifically, since the band fw' and the band fw" forming the channel 2 are bands added to higher and lower regions of the band fw of the channel 1, as shown in FIG. 21C, the interleaved data of the channel 1 are provided at the center of one frame, and the interleaved data of the channel 2 is divided into two parts which are provided at the preceding and succeeding positions thereof. For example, in the frame immediately after the timing $t_x$, the data A4, B3, C2, D1 of the channel 1 are located at the center of the frame, the data PAD, PAD, PAD, D5 are provided at the succeeding and preceding positions. This processing for arranging the data in accordance with the practical channel arrangement is also carried out in an interleaving buffer.

Since the processing for arranging the data in accordance with the practical channel arrangement is carried out, it becomes easy to carry out the processing for converting the data into the multicarrier signal in the fast Fourier Transform circuit (e.g., FFT circuit 166 shown in FIG. 12) in the encoder used upon the transmission processing.

The reception side receiving the data of two channels in one frame transmitted with the arrangement shown in FIG. 21C carries out the deinterleaving processing for restoring the data dispersed in four frames in each channel to data of one frame, thereby the reception data of two channel being obtained.

The interleaving state of the data transmitted on the channel 1 is not different before and after the new channel is added, and the data on the added channel 2 is also repeatedly subjected to the interleaving processing similar to that for the channel 1. Similarly to FIGS. 20A to 20C, FIGS. 21A to 21C are simplified diagrams used to explain outlines of the interleaving processing and the de-interleaving processing. In the actual interleaving and de-interleaving processings, the data are arranged in more complicated manner. Also in FIGS. 21A to 21C, a precise expression may be different depending upon when the abscissa is time or frequency as shown in FIG. 20B. FIGS. 21A to 21C schematically show the processing including above processing.

Since the interleaving and de-interleaving processing shown in FIGS. 21A to 21C are carried out, even if new channels are provided, then the same processing is continuously carried out in each of the channels. Therefore, it is possible to satisfactorily interleave and transmit the data without any change of the interleaving processing accompanying the change of the transmission capacity. Though not shown in FIGS. 21A to 21C, even if the number of channels are reduced, the interleaving processing for the data in the channel which is still used after the reduction of the number of channels, which enables the proper interleaving processing to be easily carried out.

While in the processing shown in FIGS. 21A to 21C both of the data on the channels 1 and 2 are subjected to the interleaving processing providing the same data arrangement, the arrangement of the interleaved data on the channel 1 and the arrangement of the interleaved data on the channel 2 may be set different from each other. The transmission capacity may be increased and reduced not only twice or ½ time but also by using a multiple of an integer of a minimum transmission capacity.

While in this embodiment the numbers of subcarriers transmitted on the channels 1 and 2 are set to the same to thereby set the capacities of information which can be transmitted on the channels 1 and 2, the capacities of information which can be transmitted on each of channels may be changed by changing the number of subcarriers on the channels 1 and 2.

While in this embodiment both of the numbers of the bands of the up-link and down-link circuits are increased or decreased, the number of the band slots of only either of circuits may be changed.

Either of the processing for changing an interleaving pattern in response to the transmission capacity and the processing for repeating the same interleaving pattern when the transmission capacity is increased is set, both of the processings may be combined and used. Specifically, in the connection sequence shown in FIG. 5, for example, when the transmission of the header information signal in the processing S104 for starting the communication on the channel 2 during the communication using the channel 1 is started, the same interleaving pattern is set for the data of the channels 1 and 2 independently, thereby the transmission and reception processings being carried out. When the timing when the audio data and so on are practically transmitted after the provision of the new channel is determined based on the transmission of the ACK signal S105, the interleaving pattern used for processing the data on the channels 1 and 2 as data of one series to interleave it may be set, thereby the data being transmitted and received.

Figure 19A:
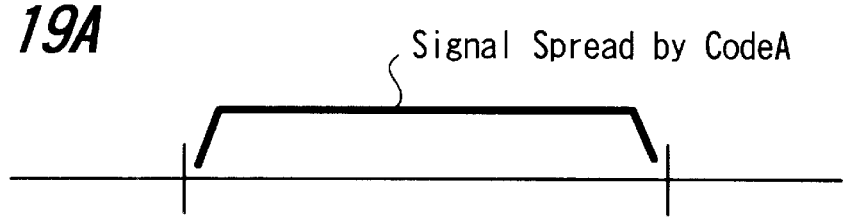
FIGS. 19A and 19B are diagrams used to explain an arrangement of a signal according to a CDMA system.
Figure 19B:
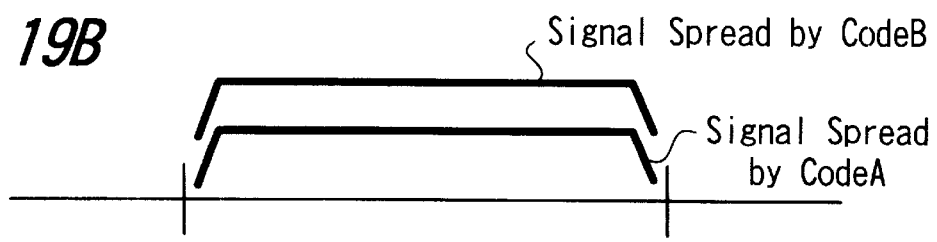

While in the above first and second embodiments the facsimile video data and the electronic mail data are transmitted as the data other than the audio data, the present invention is not limited thereto and the processings according to the embodiments can be applied to transmission of data of other kinds. They can also be applied to the processing for simultaneously setting a plurality of logical transmission channels in a communication to which other systems than the TDMA system and the multicarrier system are applied. In case of the CDMA system, for example, if data to be transmitted is dispersed by using a plurality of diffusion codes and transmitted by setting a plurality of logical transmission channels at the same time, then the transmission capacity can be increased. FIGS. 19A and 19B are diagrams showing a state of codes used in the CDMA system. The interleaving processing in the CDMA system is similar to those of the TDMA system and the multicarrier system described above.

According to the present invention, since in the interleaving processing and the deinterleaving processing in the communication using simultaneously both of the first and second transmission channels the data of the first and second transmission channels are processed as one series of data having a predetermined arrangement and arranged in a predetermined interleaving pattern, it is possible to interleave and deinterleave the data of both the transmission channels at the same time. Moreover, in case of any transmission state, it is possible to interleave and deinterleave the data with a simple processing.

According to the present invention, since in the interleaving processing and the deinterleaving processing in the communication using simultaneously both of the first and second transmission channels the data of the first and second transmission channels are processed as one series of data having a predetermined arrangement and arranged in respective interleaving patterns, respectively, it is possible to employ the common interleaving processing when either of the transmission channels is set for transmission and when both of the transmission channels are set, and hence it is possible to transmit the data satisfactorily without change of the interleaving processing resulting from change of the transmission capacity.

In this case, since the same interleaving pattern is set for the data of the first transmission channel and the data of the second transmission channel, it is possible to make the processings for respective channels common.

In the above case, since the communication using the multicarrier signal for modulating data to a plurality of symbols set at a predetermined frequency interval and transmitting them is employed as the communications of the first and second transmission channels and the symbols are arranged again to carry out the interleaving processing, it is possible to satisfactorily carry out the interleaving processing upon transmission employing the multicarrier signal.

In the above case, when the communication employing both of the first and second transmission has started, the interleaving pattern is set independently for each of the transmission channels, and after a predetermined processing is carried out, the interleaving pattern for processing the transmission data of both of the transmission channels is set, it is possible to correctly carry out the interleaving processing for increasing the channels.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A transmission method of simultaneously using first and second communication resources by variable allocation, comprising the steps of:
    if one of said first and second communication resources is solely used, interleaving data according to a predetermined pattern and solely using said one of said first and second communication resources as a unit to transmit the data; and
    if said first and second communication resources are simultaneously used, interleaving the data by using both of said first and second communication resources as a unit to transmit the data.

2. A transmission method of simultaneously using first and second communication resources by variable allocation, comprising the steps of:
    if one of said first and second communication resources is solely used, interleaving data according to a predetermined pattern and solely using said one of said first and second communication resources as a unit to transmit the data; and
    if said first and second communication resources are simultaneously used, interleaving the data according to a predetermined pattern and using both of said first and second communication resources as individual units to transmit the data.

3. A transmission method according to claim 2, wherein the step of interleaving the data individually when said first and second communication resources are simultaneously used as a unit is carried out by using the same interleaving pattern.

4. A transmission method according to claim 2, wherein the step of interleaving the data individually when said first and second communication resources are simultaneously used as a unit is carried out by using different interleaving patterns for said first and second communication resources, respectively.

5. A transmission method according to claim 2, wherein the step of interleaving the data individually when said first and second communication resources are simultaneously used as a unit is carried out by using the same interleaving patterns similar to patterns used when said one of said first and second communication resources is solely employed.

6. A transmission method according to claim 2, wherein said variable allocation is applied to only one of one direction communication and bidirectional communication.

7. A transmission method according to claim 1, wherein the use of said communication resources by said variable allocation is carried out by using a TDMA system.

8. A transmission method according to claim 1, wherein the use of said communication resources by said variable allocation is carried out by using a multicarrier system.

9. A transmission method according to claim 1, wherein the use of said communication resources by said variable allocation is carried out by using a CDMA system.

10. A transmission method according to claim 2, wherein the use of said communication resources by said variable allocation is carried out by using a TDMA system.

11. A transmission method according to claim 2, wherein the use of said communication resources by said variable allocation is carried out by using a multicarrier system.

12. A transmission method according to claim 2, wherein the use of said communication resources by said variable allocation is carried out by using a CDMA system.

13. A reception method of simultaneously using first and second communication resources by variable allocation, comprising the steps of:
    if a signal transmitted with one of said first and second communication resources being solely used is received, deinterleaving data according to a predetermined pattern and solely using said one of said first and second communication resources as a unit; and
    if a signal transmitted with said first and second communication resources being simultaneously used is received, deinterleaving data according to a predetermined pattern and using both of said first and second communication resources as a unit.

14. A reception method of simultaneously using first and second communication resources by variable allocation, comprising the steps of:
    if a signal transmitted with one of said first and second communication resources being solely used is received, deinterleaving data according to a predetermined pattern and solely using said one of said first and second communication resources as a unit; and
    if a signal transmitted with said first and second communication resources being simultaneously used is received, deinterleaving data according to a predetermined pattern and using said first and second communication resources as individual units.

15. A reception method according to claim 14, wherein the step of deinterleaving the data individually when said first and second communication resources are simultaneously used is carried out by using the same interleaving pattern for said first and second communication resources.

16. A reception method according to claim 14, wherein the step of deinterleaving the data individually when said first and second communication resources are simultaneously used is carried out by using different interleaving patterns for said first and second communication resources, respectively.

17. A reception method according to claim 14, wherein the step of deinterleaving the data individually when said first and second communication resources are simultaneously used is carried out by using the same interleaving patterns similar to patterns used when said one of said first and second communication resources is solely employed.

18. A reception method according to claim 14, wherein said variable allocation is applied to only one of one direction communication and bidirectional communication.

19. A transmission method according to claim 13, wherein the use of said communication resources by said variable allocation is carried out by using a TDMA system.

20. A transmission method according to claim 13, wherein the use of said communication resources by said variable allocation is carried out by using a multicarrier system.

21. A transmission method according to claim 13, wherein the use of said communication resources by said variable allocation is carried out by using a CDMA system.

22. A transmission method according to claim 14, wherein the use of said communication resources by said variable allocation is carried out by using a TDMA system.

23. A transmission method according to claim 14, wherein the use of said communication resources by said variable allocation is carried out by using a multicarrier system.

24. A transmission method according to claim 14, wherein the use of said communication resources by said variable allocation is carried out by using a CDMA system.

25. A transmission apparatus for simultaneously using first and second communication resources by variable allocation, comprising:
   an interleaving unit for interleaving transmission data; and
   a transmission unit for transmitting an output of interleaved data from said interleaving unit,
   wherein said interleaving unit, if one of said first and second communication resources is solely used, interleaves the transmission data according to a predetermined pattern and solely using one of said first and second communication resources as a unit to transmit the transmission data, and, if said first and second communication resources are simultaneously used, interleaves the transmission data according to a predetermined pattern and using both of said first and second communication resources as a unit to transmit the transmission data.

26. A transmission apparatus for simultaneously using first and second communication resources by variable allocation, comprising:
   an interleaving unit for interleaving transmission data according to a predetermined pattern; and
   a transmission unit for transmitting an output of interleaved data from said interleaving unit,
   wherein said interleaving unit, if one of said first and second communication resources is solely used, interleaves the transmission data by solely using said one of said first and second communication resources as a unit, and, if said first and second communication resources are simultaneously used, interleaves the transmission data by using both of said first and second communication resources as individual units.

27. A transmission apparatus according to claim 26, wherein the interleaving of the transmission data individually when said first and second communication resources are simultaneously used is carried out by using the same interleaving patterns for said first and second communication resources.

28. A transmission apparatus according to claim 26, wherein the interleaving of the transmission data individually when said first and second communication resources are simultaneously used is carried out by using different interleaving patterns for said first and second communication resources, respectively.

29. A transmission apparatus according to claim 26, wherein the interleaving of the transmission data individually when said first and second communication resources are simultaneously used is carried out by using interleaving patterns similar to patterns used when said one of said first and second communication resources is solely employed.

30. A transmission apparatus according to claim 26, wherein said variable allocation is applied to only one of one direction communication and bidirectional communication.

31. A transmission apparatus according to claim 25, wherein the use of said communication resources by said variable allocation is carried out by using a TDMA system.

32. A transmission apparatus according to claim 25, wherein the use of said communication resources by said variable allocation is carried out by using a multicarrier system.

33. A transmission apparatus according to claim 25, wherein the use of said communication resources bb said variable allocation is carried out by using a CDMA system.

34. A transmission apparatus according to claim 26, wherein the use of said communication resources by said variable allocation is carried out by using a TDMA system.

35. A transmission apparatus according to claim 26, wherein the use of said communication resources by said variable allocation is carried out by using a multicarrier system.

36. A transmission apparatus according to claim 26, wherein the use of said communication resources by said variable allocation is carried out by using a CDMA system.

37. A reception apparatus for simultaneously using first and second communication resources by variable allocation, comprising:
   a reception unit for receiving a signal with transmission data; and
   a deinterleaving unit for deinterleaving the transmission data according to a predetermined pattern in the received signal output from said reception unit,
   wherein said deinterleaving unit, if the received signal was transmitted with one of said first and second communication resources being solely used, deinterleaves the transmission data in the received signal by solely using said one of said first and second communication resources as a unit, and, if the received signal was transmitted with said first and second communication resources being simultaneously used, deinterleaves the transmission data in the received signal by using both of said first and second communication resources as a unit.

38. A reception apparatus for simultaneously using first and second communication resources by variable allocation, comprising:
   a reception unit for receiving a signal with transmission data; and
   a deinterleaving unit for deinterleaving the transmission data according to a predetermined pattern in the received signal output from said reception unit,
   wherein said deinterleaving unit, if the received signal was transmitted with one of said first and second communication resources being solely used, deinterleaves the transmission data in the received signal by solely using said one of said first and second communication resources as a unit, and, if the received signal was transmitted with said first and second communication resources being simultaneously used, deinterleaves the transmission data in the received signal by using both of said first and second communication resources as individual units.

39. A reception apparatus according to claim 38, wherein the deinterleaving of the transmission data individually when said first and second communication resources are simultaneously used is carried out by using the same interleaving pattern for said first and second communication resources.

40. A reception apparatus according to claim 38, wherein the deinterleaving of the transmission data individually when said first and second communication resources are simultaneously used is carried out by using different interleaving patterns for said first and second communication resources, respectively.

41. A reception apparatus according to claim 38, wherein the deinterleaving of the transmission data individually when said first and second communication resources are simultaneously used is carried out by using the same interleaving patterns similar to patterns used when said first and second communication resources is solely employed.

42. A reception apparatus according to claim 37, wherein said variable allocation is applied to only one of one direction communication and bidirectional communication.

43. A reception apparatus according to claim 37, wherein the use of said communication resources by said variable allocation is carried out by using a TDMA system.

44. A reception apparatus according to claim 37, wherein the use of said communication resources by said variable allocation is carried out by using a multicarrier system.

45. A reception apparatus according to claim 37, wherein the use of said communication resources by said variable allocation is carried out by using a CDMA system.

46. A reception apparatus according to claim 38, wherein the use of said communication resources by said variable allocation is carried out by using a TDMA system.

47. A reception apparatus according to claim 38, wherein the use of said communication resources by said variable allocation is carried out by using a multicarrier system.

48. A reception apparatus according to claim 38, wherein the use of said communication resources by said variable allocation is carried out by using a CDMA system.

* * * * *